United States Patent
Lee et al.

(10) Patent No.: US 7,102,446 B1
(45) Date of Patent: Sep. 5, 2006

(54) PHASE LOCK LOOP WITH COARSE CONTROL LOOP HAVING FREQUENCY LOCK DETECTOR AND DEVICE INCLUDING SAME

(75) Inventors: Hyung-Rok Lee, Sunnyvale, CA (US);
Moon-Sang Hwang, Yong-In-Si (KR);
Sang-Hyun Lee, Cupertino, CA (US);
Bong-Joon Lee, Seoul (KR);
Deog-Kyoon Jeong, Seoul (KR)

(73) Assignee: Silicon Image, Inc., Sunnyvale, CA (US)

( * ) Notice: Subject to any disclaimer, the term of this patent is extended or adjusted under 35 U.S.C. 154(b) by 37 days.

(21) Appl. No.: 11/056,995

(22) Filed: Feb. 11, 2005

(51) Int. Cl.
*H03L 7/07* (2006.01)
*H03L 7/087* (2006.01)
*H04B 1/40* (2006.01)
*H04B 1/50* (2006.01)

(52) U.S. Cl. .................. 331/11; 331/DIG. 2; 455/260

(58) Field of Classification Search ............... 331/1 A, 331/10, 11, 17, 18, 25, DIG. 2; 327/156–159; 329/325; 332/127; 360/51; 375/376; 455/260
See application file for complete search history.

(56) References Cited

U.S. PATENT DOCUMENTS 5,686,864 A * 11/1997 Martin et al. ................ 331/1 A

OTHER PUBLICATIONS

B. J. Lee et al., "A 2.5-10Gb/s CMOS Transceiver with Alternating Edge Sampling Phase Detection for Loop Characteristic Stabilization," *ISSCC Dig. Tech. Papers*, pp. 76-77, Feb. 2003.

K. Lee et al., "A CMOS Serial Link for Fully Duplexed Data Communication," *IEEE J. Solid-State Circuits*, vol. 30, pp. 353-364, Apr. 1995.

(Continued)

*Primary Examiner*—David Mis
(74) *Attorney, Agent, or Firm*—Girard & Equitz LLP

(57) ABSTRACT

A phase lock loop (PLL) for controlling a sampling clock or other clock, and a data sampling circuit, transceiver, or other device including such a PLL. The PLL includes a multi-range VCO, at least one fine control loop for controlling the VCO, and a coarse control loop for controlling the VCO by changing its frequency-voltage characteristic. The coarse control loop includes a frequency lock detector and voltage range monitoring logic. Typically, the frequency lock detector locks operation of the coarse control loop when the difference between the VCO output clock frequency and a reference frequency decreases to within a predetermined threshold, and the unlocked coarse control loop employs the voltage range monitoring logic to change the VCO frequency-voltage characteristic when the VCO's fine control voltage leaves a predetermined range. Other aspects are a transceiver (including at least two receiver interfaces and a transmitter interface) implementing a clocking scheme employing no more than three PLLs for clock generation, and a transceiver having a multi-layered receiver interface including digital circuitry and a single clock-generating PLL (an analog PLL for generating a multiphase clock to be shared by all layers of the receiver interface). Each receiver interface layer performs blind oversampling on a different received signal using the multiphase clock and the digital circuitry includes multilayered digital phase lock loop circuitry which receives the oversampled data.

23 Claims, 16 Drawing Sheets

OTHER PUBLICATIONS

S.J Song et al., "A 4-Gb/s CMOS Clock and Data Recovery Circuit Using 1/8-Rate Clock Technique," *IEEE J. Solid-State Circuits*, vol. 38, pp. 1213-1219, Jul. 2003.

J. Cao et al., "OC-192 Transmitter and Receiver in Standard 0.18-μm CMOS," *IEEE . Solid-State Circuits*, vol. 37, pp. 1768-1780, Dec. 2002.

Sidiropoulos, et al., "An 800mW 10Gb Ethernet Transceiver in 0.13 μm CMOS," *IEEE ISSCC Dig. Tech. Papers*, pp. 168-169, Feb. 2004.

T.H. Lin et al., "A 900MHz 2.5mA CMOS Frequency Synthesizer with an Automatic SC Tuning Loop," *J. Solid-State Circuits*, vol. 36, pp. 424-431, Mar. 2001.

Hyung-Rok Lee, et al., "A Fully Integrated 0.13 μm 10Gb Ethernet Transceiver with XAUI Interface," *IEEE ISSCC*, Session 9, Paper 9.3, slides, pp. 128-131 (Feb. 2004).

Hyung-Rok Lee, et al., "A Fully Integrated 0.13 μm 10Gb Ethernet Transceiver with XAUI Interface," *IEEE ISSCC*, Session 9, Paper 9.3, ten pages (Feb. 14, 2004).

\* cited by examiner

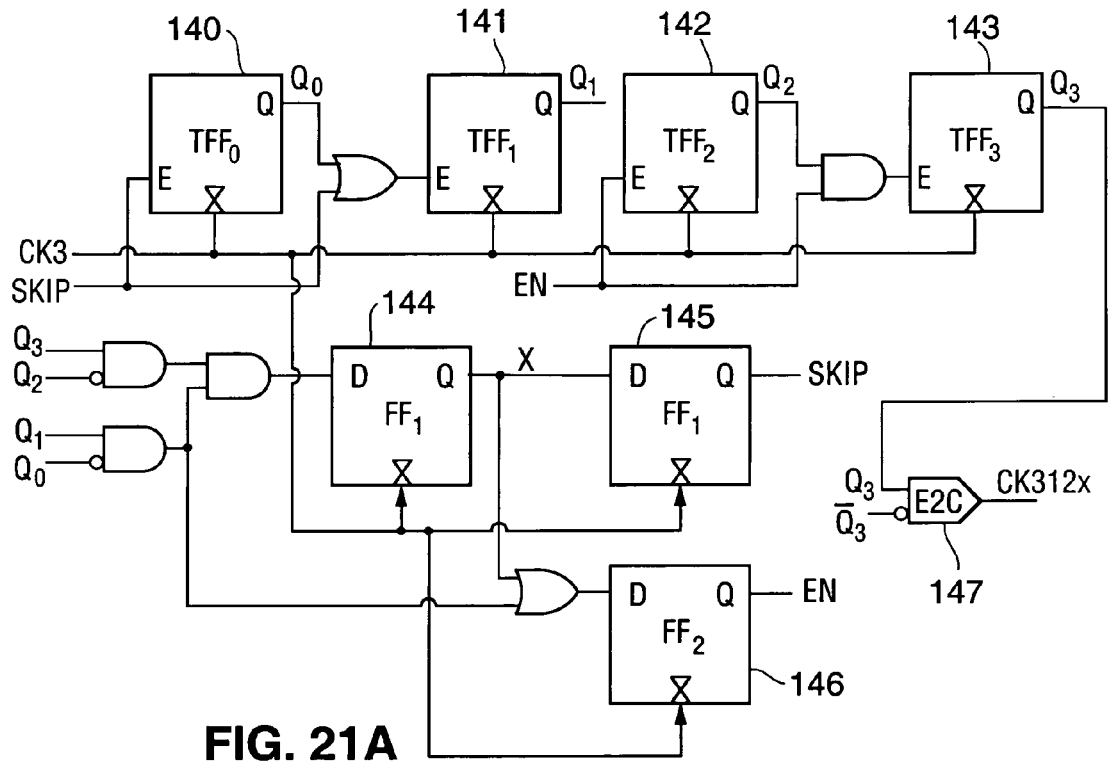
FIG. 21A
| $Q_0$ | $Q_1$ | $Q_2$ | $Q_3$ | SKIP | EN |
|---|---|---|---|---|---|
| 0 | 1 | 0 | 0 | 0 | 0 |
| 1 | 1 | 0 | 0 | 0 | 1 |
| 0 | 0 | 1 | 0 | 0 | 0 |
| 1 | 0 | 1 | 0 | 0 | 0 |
| 0 | 1 | 1 | 0 | 0 | 0 |
| 1 | 1 | 1 | 0 | 0 | 1 |
| 0 | 0 | 0 | 1 | 0 | 0 |
| 1 | 0 | 0 | 1 | 0 | 0 |
| 0 | 1 | 0 | 1 | 0 | 0 |
| 1 | 1 | 0 | 1 | 0 | 1 |
| 0 | 0 | 1 | 1 | 1 | 1 |
FIG. 21B
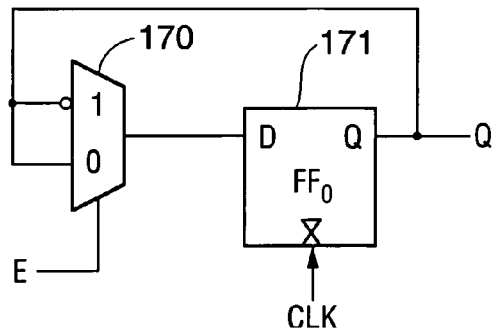
FIG. 22

PHASE LOCK LOOP WITH COARSE CONTROL LOOP HAVING FREQUENCY LOCK DETECTOR AND DEVICE INCLUDING SAME

FIELD OF THE INVENTION

The invention pertains to phase lock loop (PLL) circuits and to transceivers, transmitters, receivers, and other devices that include PLL circuits. In some embodiments, the invention pertains to a circuit (e.g., a data sampling circuit) including a PLL circuit (having both coarse control and fine control loops) for controlling the phase of a clock (e.g., a sampling clock), and to a device (e.g., an 10 Gb Ethernet transceiver) including such a PLL circuit.

BACKGROUND OF THE INVENTION

The term "transceiver" is used herein to denote any device that performs the functions of a transmitter and a receiver. The term "transmitter" is used herein in a broad sense to denote any device capable of transmitting data over a link (e.g., a serial link), and optionally also capable of performing additional functions which can include encoding and/or encrypting the data to be transmitted. The term "receiver" is used herein in a broad sense to denote any device capable of receiving data that has been transmitted over a link (e.g., a serial link), and optionally also capable of performing additional functions which can include decoding and/or decryption of the received data, and other operations related to decoding, reception, or decryption of the received data.

A transceiver typically includes a data sampling circuit that includes a feedback loop for controlling the phase of a sampling clock. Such a feedback loop typically includes a phase detector ("PD") that determines the phase error (O) present between a sampling clock and data being sampled by the sampling clock. Typically, the phase detector determines the phase error between the sampling clock and a reference clock derived from the data being sampled by the sampling clock.

The expressions "high frequency operation" and "high speed operation" are used herein synonymously to denote operation of a circuit in response to an input signal (e.g., an input clock) having frequency of 1 GHz or more (e.g., an input clock having frequency 5 GHz or 5.15625 GHz).

Transceivers (sometimes referred to as "10 Gb Ethernet transceivers") that comply with the recently established standard known as the "10 Gb Ethernet" standard (IEEE 802.3-ae, promulgated in 2002, entitled CSMA/CD Access Method and Physical Layer Specifications-MAC Parameters, Physical Layer and Management Parameters for 10 Gb/s Operation") have been implemented.

Scaled-down technology and low supply voltage allow a 10 Gb Ethernet transceiver to be implemented in a single CMOS integrated circuit which includes a 10.3125-Gb/s serial interface and a four-channel 3.125-Gb/s interface (XAUI). See, for example, the transceiver described in Sidiropoulos, et al., "An 800 mW 10 Gb Ethernet Transceiver in 0.13 μm CMOS," *IEEE ISSCC Dig. Tech. Papers*, pp. 168–169, February 2004.

For physical coding sub-layer (PCS) and management functions, it is conventional for a 10 Gb Ethernet transceiver to employ an elastic buffer or gearbox that uses 312.5 MHz and 322.27 MHz read/write clocks to generate 10.3125-Gb/s serial data in response to quad 3.125-Gb/s data, to generate quad 3.125-Gb/s data in response to 10.3125-Gb/s serial data, and to handle 64/66b coding. A 10 Gb Ethernet transceiver typically also includes a clock-multiplying unit ("CMU") or clock-and-data recovery unit ("CDR") that generates a 5.15625 GHz clock. A 10 Gb transceiver typically also includes a divide-by-16 frequency divider circuit ("÷16" circuit) and a divide-by-16.5 frequency divider circuit ("÷16.5" circuit) that generate, respectively, a 322.27 MHz clock and a 312.5 MHz clock in response to the 5.15625 GHz clock output from the transceiver's CMU or CDR. The 322.27 MHz and 312.5 MHz clocks can be supplied to divide-by-2 frequency divider circuits (to generate 161.135 MHz and 156.25 MHz clocks), and the 161.135 MHz and 156.25 MHz clocks can be used in feedback loops of data sampling circuits for sampling the 10.3125-Gb/s and 3.125-Gb/s data. Alternatively, the 322.27 MHz and 312.5 MHz clocks themselves can be used in feedback loops of data sampling circuits for sampling the 10.3125-Gb/s and 3.125-Gb/s data.

A 10 Gb Ethernet transceiver can be implemented as an integrated circuit, for example, using a 0.13-μm CMOS technology. Such an advanced CMOS technology offers fast transistor speed to achieve 10 Gb/s operation, but also poses design challenges. For example, in a PLL for generating a clock (e.g., a sampling clock) for such an integrated circuit implementation of a 10 Gb Ethernet transceiver, the reduced supply voltage narrows the input voltage range of the VCO of the PLL. If the PLL has conventional design, the reduction in supply voltage implies that VCO gain must be increased in order for the PLL to be operable over the desired frequency range under all possible PVT conditions (i.e., all possible variations in process, voltage, and temperature parameters during manufacture and operation). For example, a VCO implemented as an integrated circuit using a 0.13-μm CMOS technology and operating with a 1.2 Volt supply voltage may require a voltage-to-frequency gain of as high as 10 GHz/V to cover the desired frequency range under all possible PVT conditions.

Voltage-to-frequency gain of a VCO (sometimes denoted herein as "Kvco") is the slope of the curve indicating the VCO's output clock frequency as a function of control voltage. The functional relation of output clock frequency versus control voltage for a VCO, will sometimes be referred to herein as the "frequency-voltage characteristic" of the VCO.

Operation of a VCO having high Kvco in a PLL undesirably causes the PLL to have high noise sensitivity, since noise on the power supply and control node is modulated onto the VCO output. To make a PLL (including a VCO) operable under a wide range of PVT conditions without the need for high Kvco, it has been proposed to design the VCO to be operable with any selected one of multiple frequency-voltage characteristics each having low Kvco, with sufficient frequency overlap between the characteristics, rather than to be operable in accordance with only one frequency-voltage characteristic having large Kvco in a desired operating range. In operation of a PLL including such a VCO (sometimes referred to as a "multi-range VCO"), coarse control is achieved by causing the VCO to operate with a selected "best" one of the available frequency-voltage characteristics, and fine control is achieved by causing the VCO to operate at a "best" operating point along the selected frequency-voltage characteristic. Generally, to avoid malfunction or false operation of a PLL that includes a multi-range VCO, the PLL should satisfy the following conditions: each operating frequency must be included within a segment of at least one of the frequency-voltage characteristics; there must be sufficient frequency overlap between the frequency-voltage characteristics so that the PLL can operate at any target frequency in the full range of operating frequencies (the range of frequencies at which the PLL is intended to be operable) and the PLL can be switched between different ones of the frequency-voltage characteristics to operate at any frequency in the full range; the PLL can be switched to the appropriate frequency-voltage characteristic sufficiently rapidly regardless of initial conditions (i.e., the conditions at power on or reset); and the PLL must operate with adequate immunity to noise.

FIG. 1A is a graph of a frequency-voltage characteristic of a VCO which operates in a PLL only in accordance with this characteristic. To allow the PLL to operate at any frequency in the full range from f1 to f2 in response to control voltages V in the range VL<V<VH, where VL is a minimum control voltage and VH is a maximum control voltage, the characteristic has relatively large slope (Kvco) throughout that operating range. FIG. 1B is a graph of a set of frequency-voltage characteristics of a VCO. A modified version of the PLL of FIG. 1A includes the VCO of FIG. 1B. This modified PLL includes a coarse control loop which implements a coarse control algorithm to ensure that the VCO of FIG. 1B always operates in accordance with a current best (selected) one of the frequency-voltage characteristics. Each characteristic graphed in FIG. 1B has a relatively small slope (VCO gain). By operating in accordance with a sequence of different ones of these characteristics, the VCO of FIG. 1B can operate at any frequency in the same range (from f1 to f2) as does the VCO of FIG. 1A in response to control voltages in the same range (from VL to VH) as does the VCO of FIG. 1A. There is sufficient frequency overlap between the frequency-voltage characteristics of FIG. 1B to allow the coarse control loop to switch between them. Fine control of the PLL of FIG. 1B is achieved by choosing the best operating point along the currently selected one of the frequency-voltage characteristics.

In PLLs that use VCOs having inductor and capacitor-based design ("LC" VCOs), it is conventional to implement coarse control (of the type mentioned in the two previous paragraphs) with a coarse control loop and to implement fine control (of the type also mentioned in the two previous paragraphs) with a fine control loop (see, for example, T. H. Lin et al., "A 900 MHz 2.5 mA CMOS Frequency Synthesizer with an Automatic SC Tuning Loop," J. Solid-State Circuits, vol. 36, pp. 424–431, March 2001).

Two schemes have been employed to implement such a coarse control loop: monitoring the VCO's control voltage (for example, as described in the above-referenced paper by Lin, et al.); and directly counting edges of the VCO's output clock signal to determine its frequency directly. FIG. 2 shows circuitry for use in a conventional coarse control loop to monitor a VCO's control voltage. Since a typical LC VCO includes a MOS varactor having predictable tuning range, the FIG. 2 circuitry can be used to monitor the control voltage and achieve coarse control of an LC VCO (e.g., select a best one of multiple available frequency-voltage characteristics for the LC VCO). The FIG. 2 circuitry allows coarse control to be achieved by inferring the frequency of the VCO's output clock from the control voltage measurements using assumptions about the currently employed frequency-voltage characteristic. In operation of a coarse control loop that includes the FIG. 2 circuitry, the voltage comparators shown in FIG. 2 compare predetermined voltages VH and VL with a low-pass-filtered version (identified as "Vcap" in FIG. 2) of the fine control voltage currently being applied to the VCO. The output of the comparators is sampled, and the samples are asserted to an Up/Down counter. The Up/Down counter generates control signals for controlling the switch positions of a switched-capacitor (SC) network (not shown in FIG. 2) in response to the sampled outputs of the comparators, to allow the coarse control loop to select an assumed "best" one of multiple available frequency-voltage characteristics for the VCO. As long as predetermined voltage conditions are met (i.e., when the voltage Vcap satisfies VL<Vcap and Vcap<VH), the coarse control loop does not change the frequency-voltage characteristic of the VCO, but a fine control loop operates continuously to control the operating point along the current frequency-voltage characteristic. Coarse control implemented using the FIG. 2 circuitry is adequate where the VCO's voltage-frequency relationship is predictable and does not change unless it is changed by the coarse control loop. However, if the VCO's frequency-voltage characteristic changes (e.g., as a result of a temperature change or other environmental change) without being affirmatively changed by the coarse control loop, or if the coarse control loop otherwise makes a wrong assumption about the current frequency-voltage characteristic for the VCO, the coarse control loop will infer an incorrect current VCO output frequency from the control voltage measurements and its (incorrect) assumptions about the currently employed frequency-voltage characteristic, and thus will not generate appropriate control signals for controlling the switch positions of the switched-capacitor (SC) network to select a "best" one of the multiple available frequency-voltage characteristics for the VCO.

For example, when the voltage Vcap satisfies VL<Vcap and Vcap<VH but is much closer to VH than to VL, the FIG. 2 circuitry would not change the VCO's frequency-voltage characteristic, even where there is a high probability that a small change in supply voltage or temperature will cause the control voltage to rise above VH without any significant change in VCO output frequency (and although neither the coarse control circuitry nor fine control circuitry causes any change in operation of the VCO). If, for example, a small temperature change shifts the frequency-voltage characteristic downward, thereby increasing the control voltage to a value above VH (without significantly changing the VCO output frequency), the FIG. 2 circuitry could undesirably cause a compensating change in the frequency-voltage characteristic that raises the control voltage, which then causes the fine control circuitry to decrease the control voltage to a level just slightly above VL. In this state, another slight change in supply voltage or temperature (lowering the control voltage to below VL without changing the VCO frequency) could cause the FIG. 2 circuitry to execute another compensating change in the frequency-voltage characteristic, resulting in another move of the control voltage to another unstable value (a value slightly below VH), and so on. To prevent such unstable operation, in which the coarse control circuitry changes frequency-voltage characteristics too frequently, hysteresis must be provided. However, provision of hysteresis (e.g., by employing additional voltage comparators with reference voltages higher than VH and lower than VL) would have disadvantages (e.g., it could reduce the operating range of a selected frequency-voltage characteristic).

Another conventional scheme for implementing coarse control of a VCO (other than by VCO control voltage monitoring as described with reference to FIG. 2) is a frequency counting scheme in which edges of the VCO's output clock signal (and edges of a reference clock whose frequency is the target frequency) are counted directly. By counting such clock edges, a coarse control loop can compare the VCO output clock and reference clock frequencies and determine whether the output clock frequency is greater or less than the target frequency. Since this scheme does not assume any particular voltage-frequency relationship for the VCO, it can be used with a VCO whose operating range is less predictable than that of a typical LC VCO. However, the frequency counting method cannot itself resolve the ambiguity as to which one of multiple available frequency-voltage characteristics (all containing the target frequency) should be selected. One technique for resolving such ambiguity is to implement the PLL's coarse control loop to use predetermined rules to choose one of the candidate frequency-voltage characteristics. For example, the rules can select the lowest (or highest) candidate frequency-voltage characteristic (e.g., the candidate characteristic having lowest or highest average frequency in a given control voltage range). However, since the frequency counting method does not measure the actual control voltage, a coarse control loop relying only on the frequency counting method cannot reliably select (as an optimal frequency-voltage characteristic) one of multiple available frequency-voltage characteristics which has the target frequency nearest to the middle of its control voltage range. To reliably select (as an optimal frequency-voltage characteristic) the one of multiple candidate frequency-voltage characteristics which has the target frequency nearest to the middle of a control voltage range, a coarse control loop relying on the frequency counting method must also implement some other control technique (e.g., a complicated technique including a sweep through each of the candidate characteristics and selection of one of the candidate characteristics in which the target frequency lies nearest to the middle of the control voltage range).

It had not been known until the present invention how to implement both coarse and fine control loops in a PLL for reliable (but simply implemented) control of a ring oscillator ("ring OSC") or other VCO whose voltage-frequency characteristic is unpredictable or changes even when not affirmatively changed by the coarse control loop. The frequency-voltage characteristic of a PLL using a ring OSC as a multi-range VCO is less predictable than that of a PLL using an LC VCO in place of the ring OSC, and tends to change during operation of the PLL even when not affirmatively changed by the coarse control loop. Preferred embodiments of the present invention implement coarse control of a PLL (whose multi-range VCO is implemented as a ring OSC), e.g., a PLL in a clock and data recovery (CDR) circuit, in accordance with a robust algorithm to avoid the need for frequent resetting of the PLL's coarse control loop.

SUMMARY OF THE INVENTION

In a class of embodiments, the invention is a PLL circuit (sometimes referred to herein as a "PLL" for convenience) for controlling a clock (e.g., a sampling clock). In other embodiments, the invention is a data sampling circuit including such PLL circuit. The PLL includes a multi-range voltage-controlled oscillator ("multi-range VCO"), at least one fine control loop for controlling the VCO (typically without changing its frequency-voltage characteristic), and a coarse control loop for controlling the VCO by changing its frequency-voltage characteristic as appropriate (e.g., to compensate for changes in the VCO's frequency-voltage characteristic due to environmental changes). The coarse control loop includes a frequency lock detector (typically implemented as frequency lock monitoring logic) and voltage range monitoring logic. When the difference between the VCO output clock frequency and a reference frequency decreases to within a predetermined threshold, the frequency lock detector locks operation of the coarse control loop. When not locked, typical embodiments of the coarse control loop operate in response to the output of the voltage range monitoring logic to change the VCO's frequency-voltage characteristic when the fine control voltage asserted to the VCO leaves a predetermined range (e.g., to compensate for changes in the VCO's frequency-voltage characteristic due to environmental changes). By locking operation of the coarse control loop using a frequency lock detector, the invention avoids problems and limitations (some of which have been noted above) of conventional PLLs which use only voltage range monitoring logic to implement coarse control. In preferred embodiments in this class, the coarse control loop of the inventive PLL implements a robust digital coarse control algorithm that employs both frequency lock monitor logic and voltage range monitoring logic to avoid unnecessary changes to the VCO's frequency-voltage characteristic while appropriately changing the frequency-voltage characteristic to compensate for changes (e.g., temperature, voltage, or other environmental changes) not affirmatively caused by the coarse control loop. In preferred embodiments, the invention employs two schemes (control voltage monitoring and frequency counting) in a coarse control loop to avoid the need to resolve ambiguities as to which one of multiple available frequency-voltage characteristics the coarse control loop should select (e.g., ambiguities that would otherwise arise when using only the frequency counting scheme) and avoid unnecessary changes to the VCO's frequency-voltage characteristic that would otherwise result from using only a control voltage monitoring scheme when the VCO's voltage-frequency relationship is unpredictable or changes during operation (e.g., as a result of a temperature change or other environmental change). The invention is especially useful to control a VCO of the ring oscillator type, or any other VCO for whose voltage-frequency characteristic is unpredictable or changes during operation.

Another aspect of the invention is a data sampling circuit including a PLL (of any of the types described in the previous paragraph). Another aspect of the invention is a 10 Gb Ethernet transceiver (typically implemented as or in a single CMOS IC) including a 10.3125-Gb/s serial interface, a four-channel 3.125-Gb/s interface (sometimes referred to as a "XAUI"), and at least one PLL implemented in the 10.3125-Gb/s serial interface in accordance with the invention. Other aspects of the invention are other devices that include any embodiment of the inventive PLL.

Some embodiments of the coarse control circuitry of the inventive PLL include digital circuitry for generating coarse control bits, and a DAC for generating a coarse control voltage (for assertion to a VCO) in response to the coarse control bits. When the VCO of the PLL is a ring oscillator including CMOS delay cells connected in a ring structure, use of the DAC allows each of the VCO's delay cells to be implemented much more simply than would be required if the coarse control bits were asserted directly to the VCO's delay cells.

Another aspect of the invention is a transceiver (e.g., a 10 Gb Ethernet transceiver, typically implemented as or in a single CMOS IC) including a first receiver interface configured to receive data having a first data rate (e.g., a four-channel 3.125-Gb/s interface comprising four layers, or another multi-layered receiver interface), a second receiver interface configured to receive data at a second data rate greater than the first data rate (e.g., a 10.3125-Gb/s receiver interface), at least one transmitter interface configured to transmit data having a third data rate (identical to or different than the second data rate) greater than the first data rate (e.g., a 10.3125-Gb/s transmitter interface), and additional circuitry (e.g., circuitry for performing physical coding sublayer (PCS) and management functions). The device implements a clocking scheme in which no more than three phase locked loops are used for clock generation. For example, the transceiver can include only three clock-generating PLLs: a first PLL in circuitry which generates all clocks generated (and needed) by the first receiver interface and at least one clock needed by the additional circuitry; a second PLL in circuitry which generates all clocks needed by the second receiver interface and at least one clock generated (and needed) by the additional circuitry; and a third PLL in circuitry which generates all clocks generated (and needed) by the transmitter interface and at least one clock needed by the additional circuitry.

Another aspect of the invention is a transceiver (e.g., a 10 Gb Ethernet transceiver, typically implemented as or in a single CMOS IC) including a multi-layered receiver interface for receiving and sampling signals, each of the signals being indicative of data having a first data rate (e.g., a four-channel 3.125-Gb/s interface). The receiver interface includes digital circuitry and a single clock-generating PLL: an analog PLL circuit for generating a multiphase clock (to be shared by all layers of the receiver interface). The analog PLL circuit generates all clocks (including the multiphase clock) generated by the receiver interface, or each clock (other than the multiphase clock) generated by the receiver circuitry is generated by circuitry that does not include (and is not) a clock-generating PLL. Each layer of the receiver interface performs blind oversampling on one of the received signals using the multiphase clock. The digital circuitry of the receiver interface includes multilayered digital phase lock loop (DPLL) circuitry which receives the oversampled data. Each layer of the DPLL circuitry effectively selects one phase of the multiphase clock at which one received signal is sampled (by selecting a subset of the oversampled data samples having a "best" phase). The DPLL circuitry typically includes a phase detector ("PD") that determines a phase error ($\phi_A$) present between each of multiple sampling clocks (determined by the multiphase clock) and data (determined by a received signal) being sampled by each such sampling clock. Because all layers of the receiver interface implement blind oversampling, the digital circuitry (including each layer of the DPLL circuitry) of the receiver interface (and any analog circuitry, other than the analog PLL circuit, of the receiver interface) can share the multiphase clock and/or use clocks derived therefrom. Thus, synchronization is readily achieved between all clocks employed by the receiver interface. When the receiver interface is integrated with additional digital circuitry, and the only analog circuitry in the receiver interface is the shared analog PLL circuit, the digital circuitry of the receiver interface (including the DPLL circuitry) can be synthesized along with the additional digital circuitry, e.g., to achieve good portability.

Other aspects of the invention are a transceiver (preferably implemented as an integrated circuit) including any embodiment of the inventive PLL, a transmitter (preferably implemented as an integrated circuit) including any embodiment of the inventive PLL, and a receiver (preferably implemented as an integrated circuit) including any embodiment of the inventive PLL.

BRIEF DESCRIPTION OF THE DRAWINGS

In FIG. 17(b), circuit delay is ignored for simplicity.

FIG. 19(b) also includes a timing diagram of signals received or generated by the ÷1.5 frequency divider of FIG. 19(b).

FIG. 21(a) is a simplified schematic diagram of an embodiment of the ÷5.5 frequency divider of FIG. 17(a).

FIG. 21(b) is a state diagram for the circuit of FIG. 21(a).

FIG. 22 is a simplified schematic diagram of an implementation of each of circuits 140, 141, 142, and 143 of FIG. 21(a).

DETAILED DESCRIPTION OF PREFERRED EMBODIMENTS

Figure 1A:
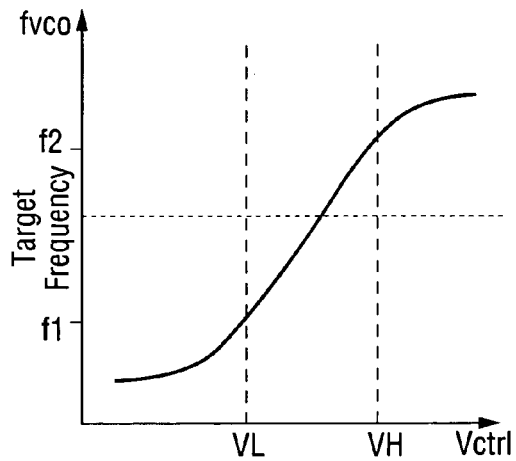
FIG. 1A is a graph of a frequency versus control voltage characteristic of a VCO in a PLL. The characteristic has a relatively large slope (VCO gain) when the PLL operates in response to a control voltage in a range from VL (a minimum control voltage) to VH (a maximum control voltage).
Figure 1B:
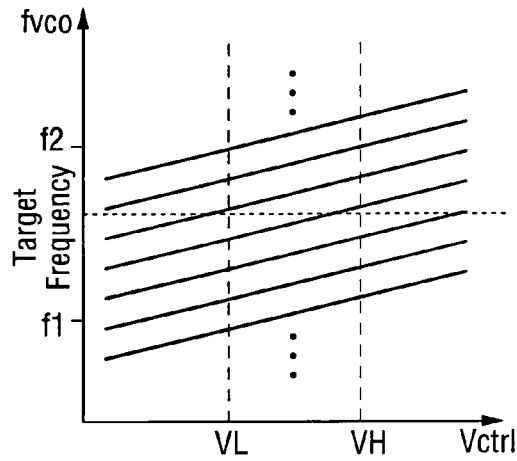
FIG. 1B is a graph of a set of frequency versus control voltage characteristics of a VCO in a modified version of the PLL whose characteristic is graphed in FIG. 1A. The PLL is configured so that each characteristic can be selected in accordance with a coarse control algorithm. Each characteristic has a relatively small slope (VCO gain) when the PLL operates in response to a control voltage in the range from VL to VH.
Figure 2:
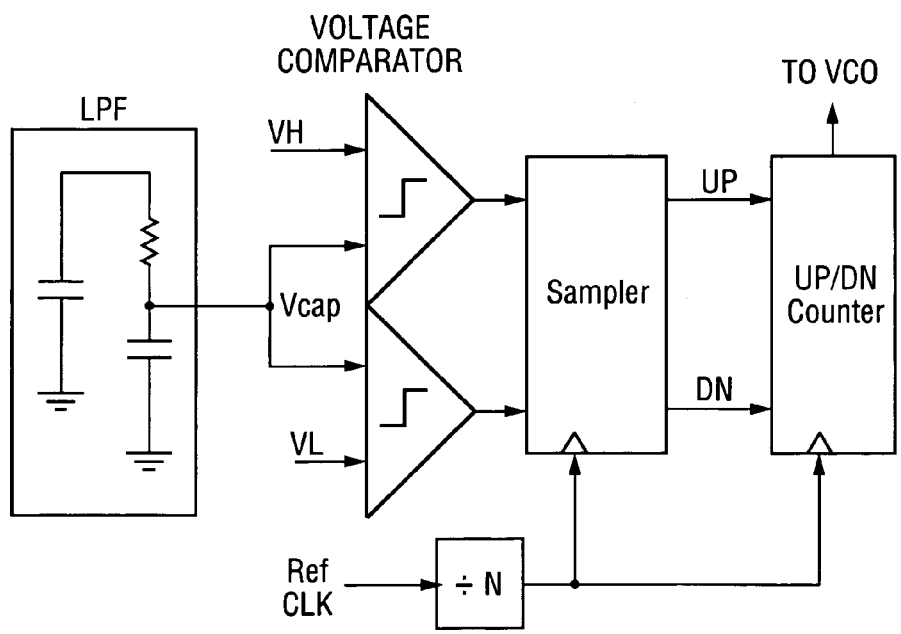
FIG. 2 is a block diagram of conventional circuitry for use in a coarse control loop of a PLL including a multi-range VCO.
Figure 3:
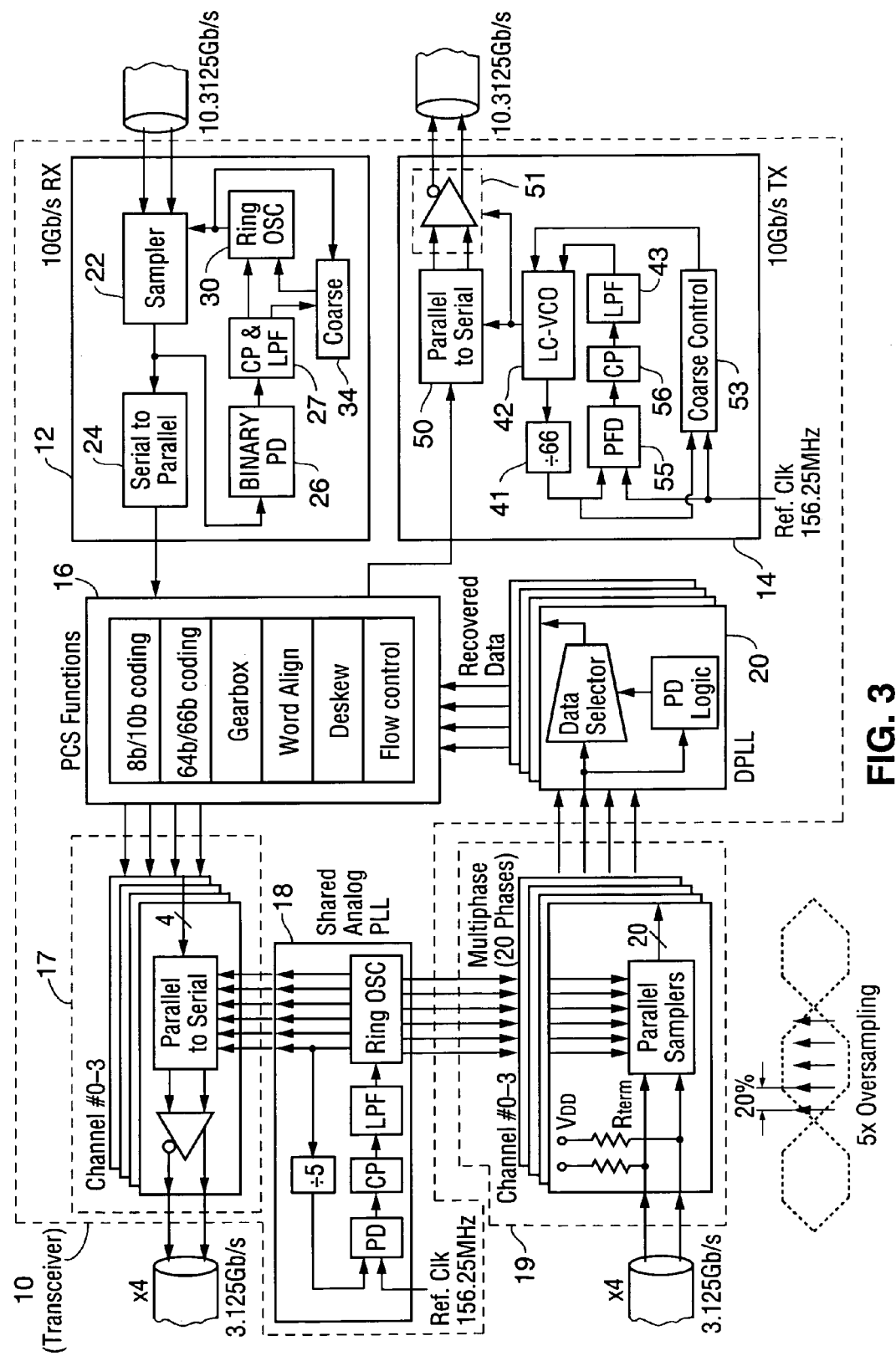
FIG. 3 is a block diagram of an integrated circuit implementation of a 10 Gb Ethernet transceiver which is an embodiment of the invention.

FIG. 3 is a block diagram of an integrated circuit implementation of a 10 Gb Ethernet transceiver which is an embodiment of the invention. Transceiver chip 10 of FIG. 3 includes a 10.3125 Gb/s Serializer/Deserializer (SerDes) including 10.3125 Gb/s receiver 12 and 10.3125 Gb/s transmitter 14, a four-layer 3.125 Gb/s SerDes including four-layer 3.125 Gb/s transmitter 17, four-layer 3.125 Gb/s receiver 19, and four-layer digital phase lock loop (DPLL) circuitry 20, and physical coding sublayer (PCS) circuitry 16 between the 10.3125 Gb/s SerDes and the 3.125 Gb/s SerDes. Transmitter 14 is configured to transmit over a serial link a differential signal indicative of a bit stream having data rate 10.3125 Gigabits/second. Receiver 12 is configured to receive (from a serial link) and sample a differential signal indicative of a bit stream having data rate 10.3125 Gigabits/second. Transmitter 17 is configured to transmit four differential signals, each over a different serial link, each such signal being indicative of a bit stream having data rate 3.125 Gigabits/second.

Receiver 19 includes four circuits (denoted herein as "layers"), each coupled to receive a different one of four differential input signals. Each of the input signals is indicative of a different bit stream having data rate 3.125 Gigabits/second. Although the incoming data rates of the signals received by receiver 19 are the same, the phases of the data streams recovered therefrom can be different from each other.

Receiver 19 and DPLL 20 could be replaced by four receiver layers, each implementing a tracking type CDR, but the tracking type CDR circuitry would require at least four different clock domains and the four data streams recovered by the CDR circuitry would thus need to be retimed to one central clock. Instead, this troublesome clock synchronization problem is eliminated by employing receiver 19 and DPLL 20 to perform blind oversampling of the incoming signals and selection of a subset of the resulting samples as the recovered data, with all layers of receiver 19 and DPLL 20 sharing a single clock domain. Instead of implementing each layer of receiver 19 to track incoming data with its own PLL, the FIG. 3 embodiment uses shared analog PLL 18 to generate a fixed frequency multiphase clock signal which is shared by receiver 19, DPLL 20, and transmitter 17. A data selector within DPLL 20 selects recovered data (from among the blind oversampled data samples asserted to DPLL 20), preferably using a digital edge tracking algorithm.

The expression "multiphase clock" is used herein to denote a set of L clocks, each having frequency $f_{dck}$ and each having a different phase $\phi_m$ that satisfies $\phi_m = \phi_{offset} \div 2\pi(m/L) + \Delta\phi_m$ where the index "m" is a non-negative integer in the range $\{0, \ldots, L-1\}$, and $\Delta\phi_m$ is an error term. Typically $\Delta\phi_m$ is much smaller than the phase increment $2\pi/L$, and a multi-phase clock set is generated to approximate (as closely as is practical) an ideal multi-phase clock set consisting of L clocks, each having frequency $f_{dck}$ and each having a different phase $\phi_m = \phi_{offset} + 2\pi(m/L)$. In typical applications, a multiphase clock is generated in response to a principal clock having frequency $f_{dck}$ and phase $\phi_{offset}$ (in other typical applications, the principal clock has frequency other than $f_{dck}$).

Receiver 19 and DPLL 20 employ a blind oversampling CDR technique as described in, for example, K. Lee et al., "A CMOS Serial Link for Fully Duplexed Data Communication," IEEE J. Solid-State Circuits, vol. 30, pp. 353–364, April 1995. Since a blind oversampling CDR simply selects recovered data from among equally-spaced samples (generated using an oversampling clock) generated during each bit period instead of continuously adjusting the sample timing, the four layers of receiver 19, the four layers of transmitter 17, and the layers of DPLL 20, can and do share a common multiphase clock domain. Thus, synchronization is readily achieved between all clocks employed by receiver 19 and DPLL 20. When analog PLL 18, receiver 19, DPLL 20, and PCS circuitry 16 are integrated within a single chip, and there is only digital circuitry (not analog circuitry) within DPLL 20 and PCS circuitry 16, the digital circuitry of DPLL 20 and PCS circuitry 16 can be synthesized, e.g., to achieve good portability.

Still with reference to FIG. 3, analog PLL 18 includes a VCO (implemented as a ring oscillator including CMOS delay cells connected in a ring structure) which is controlled to generate a multiphase clock (having 20 different phases). Each individual clock of this multiphase clock has frequency 781.25 MHz. Since each layer of receiver 19 receives incoming data at the rate 3.125 Gb/s, each layer is configured to process groups of four sequentially received bits in parallel, in the following sense. During each cycle of the multiphase clock (i.e., once during each period of duration $(781.25 \text{ MHz})^{-1}$), each layer of receiver 19 performs blind 5×-oversampling on the incoming signal using the multiphase clock to generate twenty samples of the incoming signal. Each set of twenty samples is 5×-oversampled data indicative of four sequentially received bits of the received signal. Each layer of receiver 19 is implemented with a parallel architecture (to process groups of four sequentially received bits in parallel) so that receiver 19 can operate in response to a clock having lower frequency (781.25 MHz) than the incoming data rate (4*781.25 Mb/s=3.125 Gb/s), and so that this relatively low frequency (781.25 MHz) clock can also be used by other circuitry in the transceiver (e.g., DPLL 20) which could not practically operate in response to a higher frequency clock. Thus, a preferred implementation of receiver 19 asserts a sequence of 80-bit data sample words to DPLL 20 (twenty sample bits from each layer of receiver 19 to a corresponding layer of DPLL 20 per cycle of the 781.25 MHz) clock). Once per cycle of the 781.25 MHz clock, DPLL 20 selects a best one of each set of five candidate samples from receiver 19, and each layer of DPLL 20 outputs a best four-sample subset of a set of twenty candidate samples. Thus, DPLL 20 asserts to PCS circuitry 16 a total of sixteen recovered data bits (indicative of four bits of each of the four incoming signals) during each cycle of the 781.25 MHz clock.

Figure 3A:
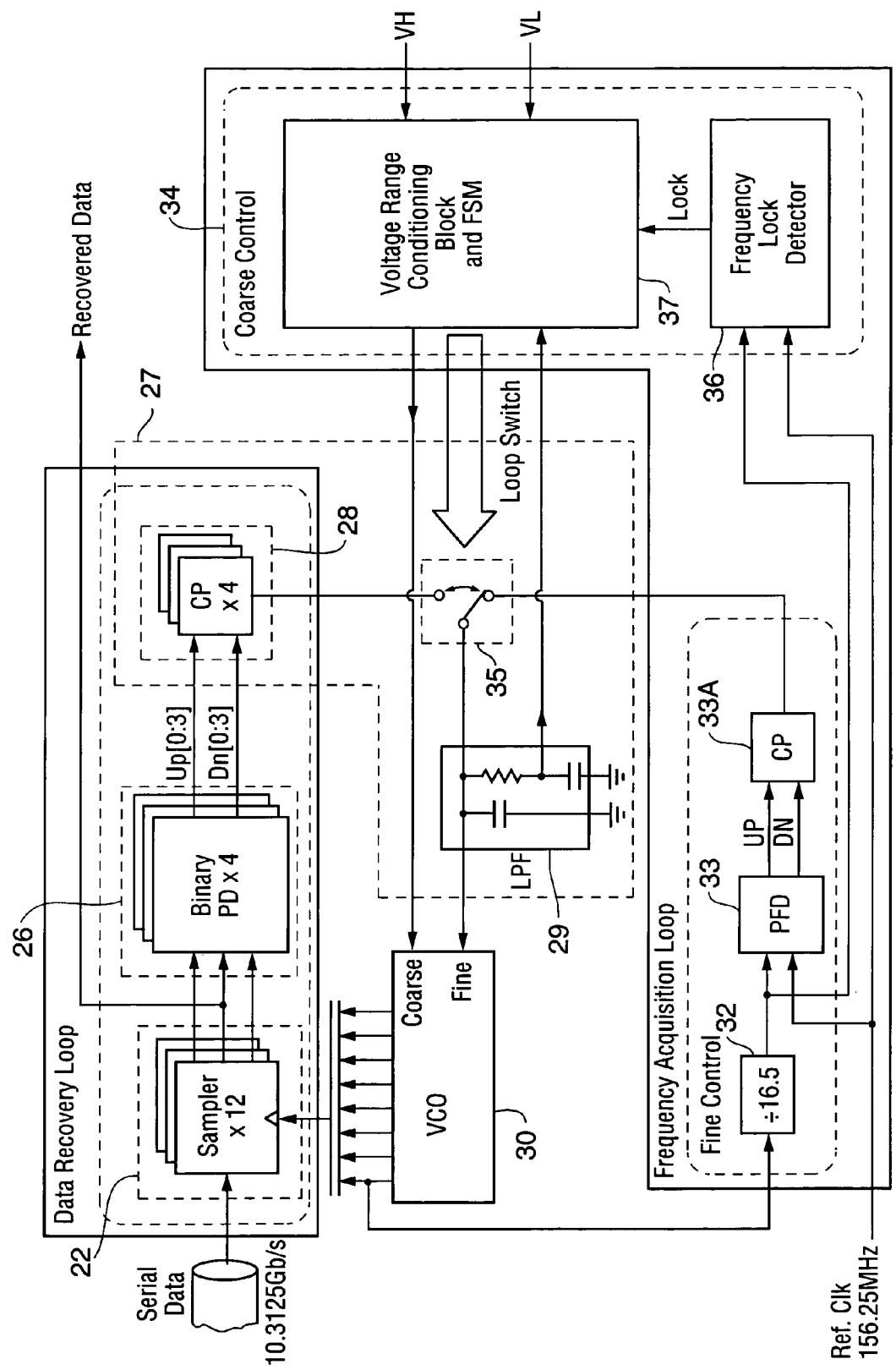
FIG. 3A is block diagram of an implementation of circuitry 12 (which is a 10.3125 Gb/s receiver) of FIG. 3.
Figure 3B:
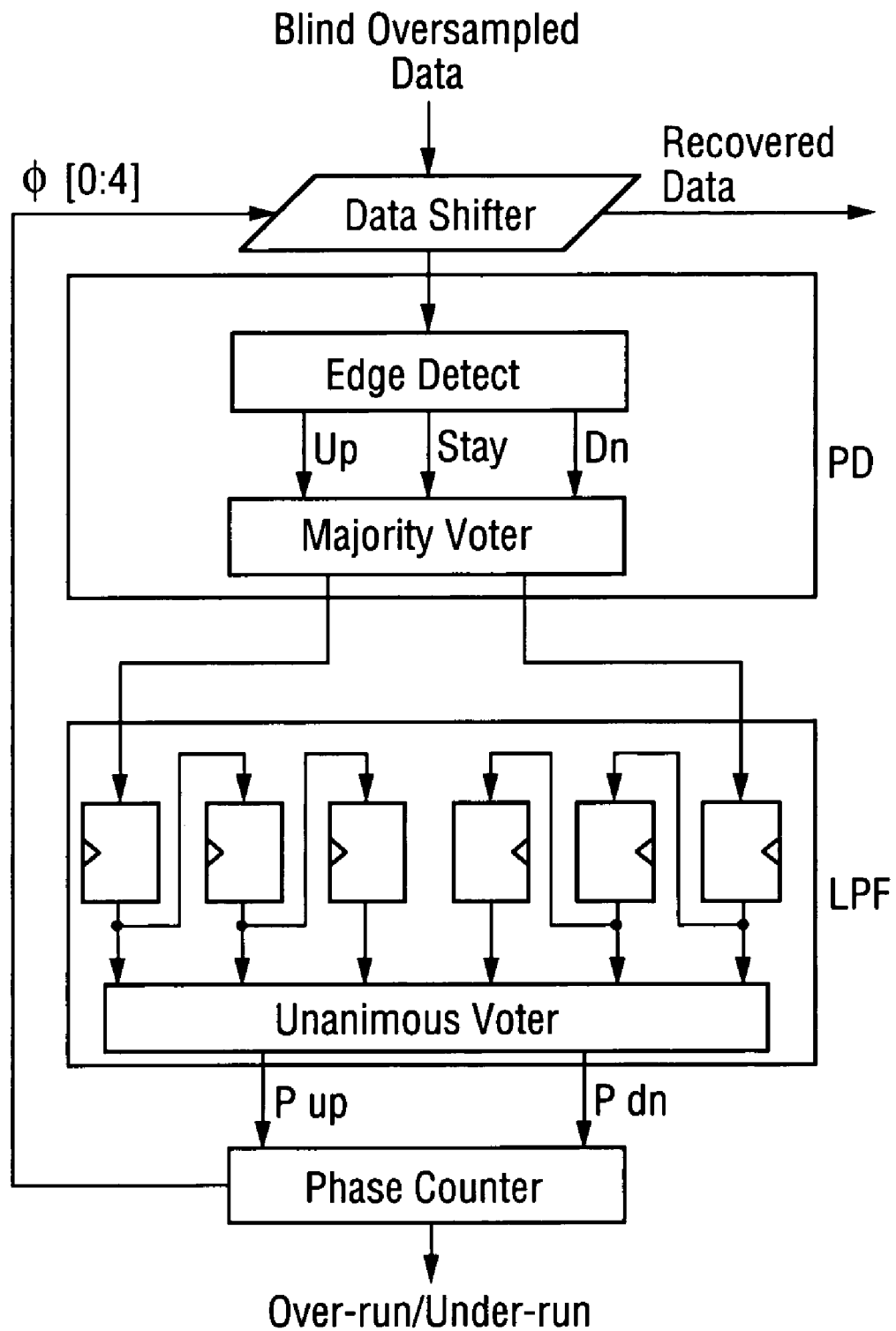
FIG. 3B is a block diagram of one layer of circuitry 20 of FIG. 3.

FIG. 3B shows the structure of a preferred implementation of one of the four identical layers of DPLL 20, which includes a data shifter, edge detection circuitry, majority voter circuitry, shift registers, unanimous voter circuitry, and phase counter logic, connected as shown. During each cycle of the 781.25 MHz clock, twenty samples (candidate samples) of blind oversampled data (from one layer of receiver 19) are loaded into the data shifter of FIG. 3B. A phase selection word ("$\phi[0:4]$") asserted by the phase counter logic selects a four-sample subset from each set of twenty candidate samples for output (as "recovered data") from this layer of DPLL 20 to PCS circuitry 16. Specifically, $\{\phi[0]=0, \phi[1]=0, \phi[2]=1, \phi[3]=0, \text{ and } \phi[4]=0\}$ selects the third one of each set of five consecutive candidate samples as a bit of recovered data, $\{\phi[0]=0, \phi[1]=1, \phi[2]=0, \phi[3]=0, \text{ and } \phi[4]=0\}$ selects the second one of each set of five consecutive candidate samples as a bit of recovered data, and so on. The edge detector and the majority voter circuitry examine the twenty candidate samples in the data shifter to determine therefrom the phase of the transitions between successive ones of the four bits of data represented by the twenty candidate samples (i.e., to determine a data transition phase), and to generate filtered binary control bits ("up," "down," and "stay") indicative of relation between the data transition phase and the phase determined by the current phase selection word $\phi[0:4]$ (where the "phase" determined by the current phase selection word $\phi[0:4]$ can be denoted as "n" when $\phi[n]=1$ and all other bits of $\phi[0:4]$ are indicative of logical zeros). The filtered binary control bits are used for clock phase adjustment, in the sense that they are used to update the current phase selection word $\phi[0:4]$. The majority voter circuitry filters raw binary control bits ("up," "down," and "stay") generated by the edge detector to filter out false indications of phase mismatch, and thereby prevent the bits of the phase selection word $\phi[0:4]$ from being changed too frequently. Once per cycle of the 781.25 MHz clock, the shift registers and unanimous voter circuitry generate updated control bits "Pup" and "Pdn" in response to the filtered binary control bits from the majority voter circuitry. The control bits "Pup" and "Pdn" determine whether the phase determined by the current phase selection word $\phi[0:4]$ should be advanced or retarded. The unanimous voter circuitry generates control bits "Pup" and "Pdn" that cause advancement of the phase determined by the current phase selection word $\phi[0:4]$ only in response to three consecutive decisions by the majority voter circuitry (in the three most recent cycles of the 781.25 MHz clock) to advance such phase. Similarly, the unanimous voter circuitry generates control bits "Pup" and "Pdn" that cause retardation of the phase determined by the current phase selection word $\phi[0:4]$ only in response to three consecutive decisions by the majority voter circuitry (in the three most recent cycles of the 781.25 MHz clock) to retard such phase. The phase counter updates the phase selection word $\phi[0:4]$ in response to the control bits "Pup" and "Pdn." Thus, the unanimous voter circuitry functions as a low pass filter.

Figure 11:
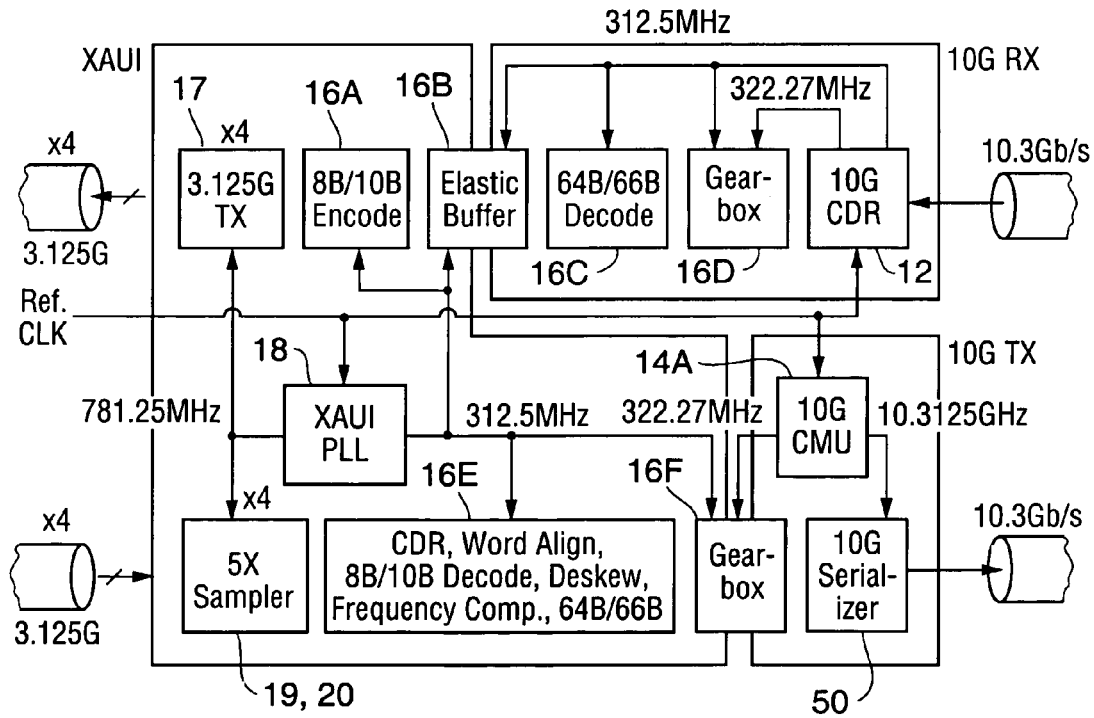
FIG. 11 is a block diagram of elements of the FIG. 3 transceiver, shown partitioned into three clock domains.

With reference again to FIG. 3, PCS circuitry 16 is configured to perform several digital functions such as 8 bit/10 bit coding, 64 bit/66 bit coding, clock rate compensation, deskew, word alignment, gearbox, and flow control functions. Since the recovered data from the four layers of DPLL 20 are already in a single clock domain, PCS circuitry 16 can be implemented much more simply to perform word alignment and deskew functions than would otherwise be required, and the size of FIFOs within PCS circuitry 16 can be smaller than would otherwise be required if receiver 19 and DPLL 20 were replaced by four receiver layers, each implementing a tracking type CDR. Instead of adjusting PLL frequency to incoming data rate, receiver 19 oversamples the incoming signals using a fixed frequency multiphase clock generated by analog PLL 18. Thus, DPLL 20, which includes frequency compensation logic that compensates for the frequency offset between the incoming data and the system clock can be integrated in the same block of digital circuitry in which PCS circuitry 16 is implemented. Since all of receiver 19, transmitter 17, receiver 12, and transmitter 14 use the same reference clock (in a preferred implementation of transceiver 10 of FIG. 3), there is no need for such preferred implementation of transceiver 10 to include frequency compensation logic between receiver 19 and transmitter 14. The gearbox circuitry (within PCS circuitry 16) between receiver 19 and transmitter 14 is preferably of the type specified by the above-referenced "10 Gb Ethernet" standard, which converts the data width from 33 bits to 32 bits without changing the data throughput. In order not to change total throughput, the gearbox circuitry between receiver 19 and transmitter 14 uses a 322.27 MHz clock (as indicated in FIG. 11) along with a 312.5 MHz clock ($33/32 \times 312.5$ MHz=322.27 MHz). The gearbox circuitry (within PCS circuitry 16) between receiver 12 and transmitter 17 is preferably also of the type specified by the above-referenced "10 Gb Ethernet" standard, and this gearbox circuitry also uses a 322.27 MHz clock along with a 312.5 MHz clock (as indicated in FIG. 11).

Preferably, each block of FIG. 3 is optimized to maximize performance and to reduce the overall complexity of transceiver 10. For example, transmitter 14 includes an LC-VCO (VCO 42) for better jitter performance (although this type of VCO requires more area on the chip), but receiver 12 includes a ring OSC (VCO 30) which includes CMOS delay cells connected in a ring structure, since such a ring OSC can be implemented using less area on the chip than would be required to implement an LC-vCO.

FIG. 11 is a block diagram of elements of transceiver 10 of FIG. 3, showing how they are partitioned into three clock domains. One domain includes analog PLL circuitry 18 which generates a 781.25 MHz multiphase clock for transmitter 17, receiver 19, and DPLL 20, and a 312.5 MHz clock for DPLL 20 and 8 bit/10 bit encoding portion 16A, elastic buffer portion 16B, and word alignment, decoding, deskewing, frequency compensation, and 64 bit/66 bit encoding portion 16E of circuitry 16. The second domain includes receiver 12 which uses a 2.578 GHz clock to sample a received data signal and includes a "divide by 8.25" frequency divider for generating a 312.5 MHz clock (from the 2.578 GHz clock) for use within receiver 12 and by elastic buffer portion 16B, 64 bit/66 bit decoding portion 16C, and gearbox portion 16D of circuitry 16, and also generates a 322.27 MHz clock for use by gearbox portion 16D of circuitry 16. The third domain includes clock-multiplying unit portion 14A of transmitter 14 which generates a 10.3125

GHz clock for use within portion 50 of transmitter 14, and includes a "divide by 32" frequency divider for generating a 322.27 MHz clock (from the 10.3125 GHz clock) for use by gearbox portion 16F of circuitry 16. Each clock domain receives and operates in response to a 156.25 MHz reference clock.

Figure 12:
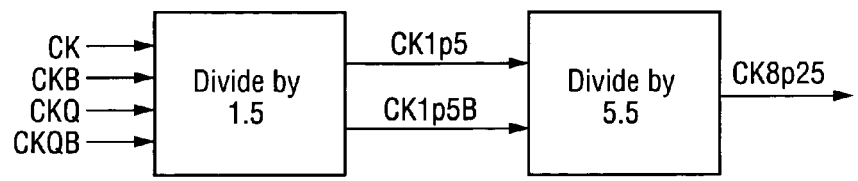
FIG. 12 is a block diagram of a "divide by 8.25" frequency divider that can be used in a transceiver that embodies the invention.
Figure 13:
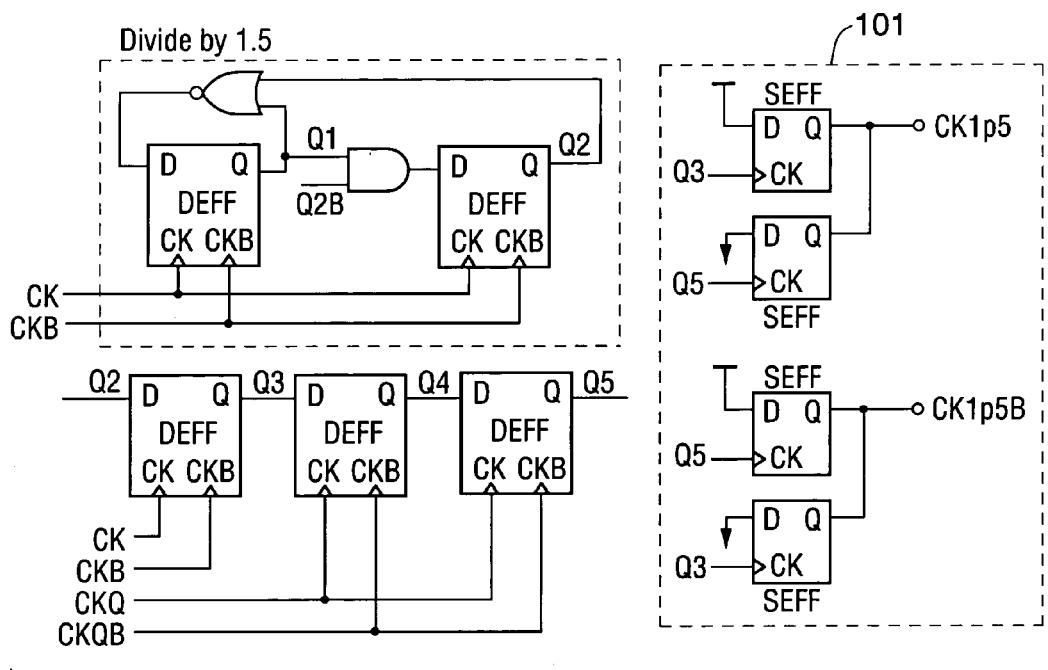
FIG. 13 is a schematic diagram of an implementation of a "divide by 1.5" frequency divider used in the FIG. 12 frequency divider.
Figure 14:
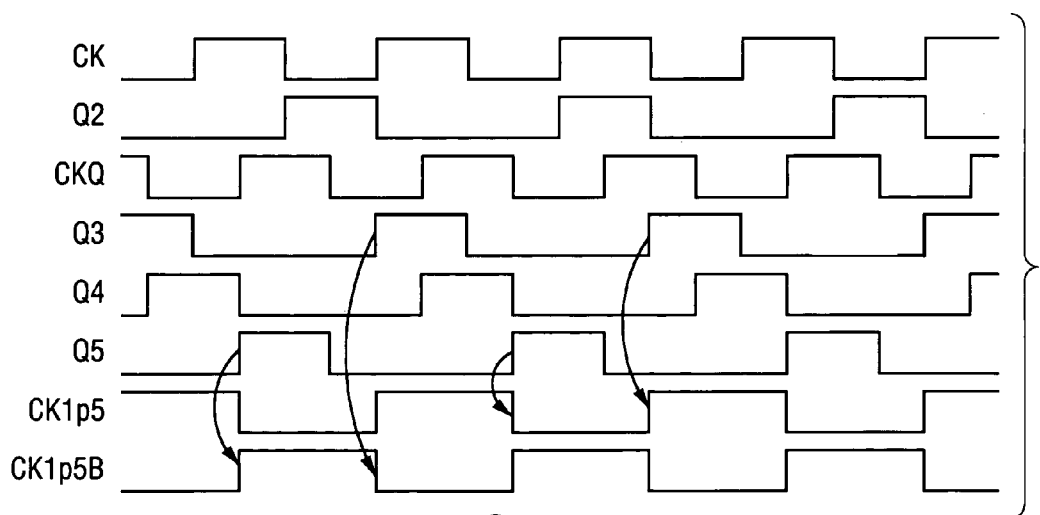
FIG. 14 is a timing diagram showing signals received or generated by the FIG. 13 circuit.

The "divide by 8.25" frequency divider within receiver 12 can be implemented by cascaded "divide by 1.5" and "divide by 5.5" frequency divider circuits as shown in FIG. 12. The divide by 1.5 circuit can be realized using a double edge triggered flip-flop ("double edge triggered D-FF" or "DEFF") in place of a single edge triggered flip flop ("single edge triggered D-FF" or "SEFF") in a conventional "divide by 3" circuit. FIG. 13 is a schematic diagram of an implementation of the "divide by 1.5" frequency divider, FIG. 14 is a timing diagram showing signals received or generated by the FIG. 13 circuit, FIG. 15 is a schematic diagram of an implementation of the "divide by 5.5" frequency divider, and FIG. 16 is a timing diagram showing signals received or generated by the FIG. 15 circuit.

The frequency divider of FIG. 13 receives input clock CK, the inverse ("CKB") of clock CK, a 90'-phase-delayed version ("CKQ") of clock CK (CKQ has 90° phase delay relative to clock CK), and the inverse ("CKQB") of clock CKQ. The frequency divider of FIG. 13 includes logic for generating signals Q2, Q3, Q4, and Q5 whose waveforms are shown in FIG. 14, and duty cycle corrector 101 which generates the differential clock output (CK1$p$5 and CK1$p$5B) of FIG. 13 in response to signals Q3 and Q5. Duty cycle corrector 101 generates each component CK1$p$5 and CK1$p$5B of the differential clock output with a duty cycle of 50% to maximize the timing margin of the "divide by 5.5" frequency divider of FIG. 15. In contrast, FIG. 14 shows that the duty cycle of signal Q2 (generated by a double edge triggered flip-flop of the FIG. 13 circuitry) is 33%. To allow generation of each component (CK1$p$5 and CK1$p$5B) of the differential clock output with a 50% duty cycle, the Q2 signal is sequentially latched as indicated to generate the signals Q3, Q4 and Q5. Using the rising edge of Q3 and Q5, the duty cycle corrector generates components CK1$p$5 and CK1$p$5B of the differential clock output.

Figure 15:
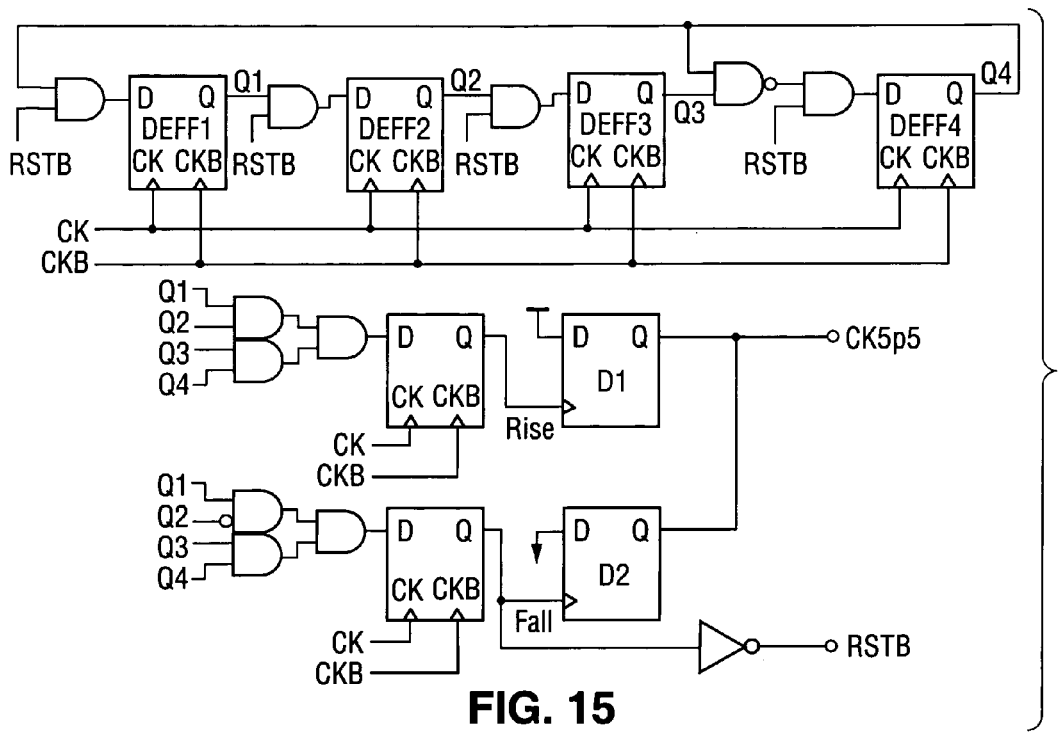
FIG. 15 is a schematic diagram of an implementation of a "divide by 5.5" frequency divider used in the FIG. 12 frequency divider.
Figure 16:
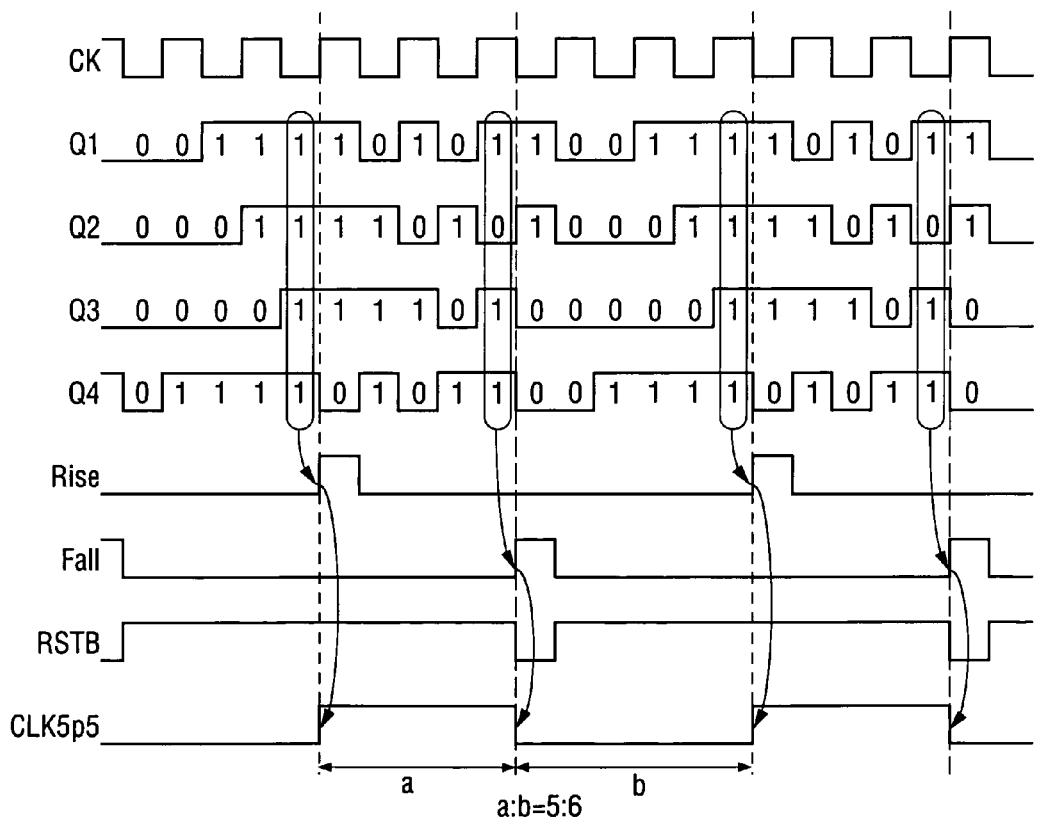
FIG. 16 is a timing diagram showing signals received or generated by the FIG. 15 circuit.

The frequency divider of FIG. 15 has the design of a conventional "divide by 11" frequency divider with two conventional double edge triggered flip-flops replaced by a pair of single edge triggered flip-flops that generate output clock CK5$p$5 as indicated. The frequency divider of FIG. 15 generates output clock CK5$p$5 in response to the differential clock (CK1$p$5 and CK1$p$5B) generated by the FIG. 13 circuit, but the components of differential clock CK1$p$5 and CK1$p$5B are respectively labeled CK and CKB in FIG. 15 for convenience. The duty cycle of FIG. 15's output signal CK5$p$5 is $5/11$. Since the duty cycle of output signal CK5$p$5 is nearly 50% and this signal has relatively low frequency, there is no need for the FIG. 15 circuit to include a duty cycle corrector (similar to that included in FIG. 13).

Receiver 12 preferably includes a "divide by 16.5" frequency divider (i.e., "divide by 16.5" frequency divider 32 of FIG. 3A), to be described below. This "divide by 16.5" frequency divider can be implemented in any way, but is preferably implemented as a cascade of the above-described "divide by 8.25" and a conventional "divide by 2" frequency divider. If the "divide by 16.5" frequency divider is implemented by cascaded "divide by 8.25" and "divide by 2" dividers, the "divide by 8.25" divider can be used to generate the above-discussed 312.5 MHz clock used by circuitry 16B, 16C, and 16D of FIG. 11, as well as to provide input to the "divide by 2" divider (or to receive the output of the "divide by 2" divider).

Receiver 12 of FIG. 3 recovers a stream of binary data and a 5.15625 GHz clock from the signal it receives over the indicated 10.3125 Gb/s serial link, preferably using binary phase detection with a dead-zone (for example, as described in B. J. Lee et al., "A 2.5–10 Gb/s CMOS Transceiver with Alternating Edge Sampling Phase Detection for Loop Characteristic Stabilization," *ISSCC Dig. Tech. Papers*, pp. 76–77, February 2003). The CDR circuitry of receiver 12 (to be described below) uses multiphase clocks for clock and data recovery, and the VCO within receiver 12 is a ring oscillator ("ring OSC") that occupies only a small area of the transceiver chip.

We next describe typical implementations of 10 Gb/s receiver 12 of FIG. 3. As shown in FIG. 3, sampling circuitry (sampler) 22 of receiver 12 generates samples of a signal received by transceiver 10 over a 10.3125 Gb/s serial link, using a 2.578 GHz clock generated by VCO 30. VCO 30 is a ring OSC, including CMOS delay cells connected in a ring structure and having inputs for fine control voltages and coarse control voltages. Serial to parallel conversion circuitry 24 parallelizes the samples generated by sampler 22 and asserts them to PCS circuitry 16 for decoding and other processing. Receiver 12 includes PLL circuitry (including a coarse control loop and two fine control loops) for controlling VCO 30. FIG. 3 shows some elements of the fine control loops and coarse control circuitry 34 of the coarse control loop. The PLL circuitry controls VCO 30 to cause it to generate the 2.578 GHz clock (for use by sampling circuitry 22), including by locking the frequency of VCO 30's output to a 156.25 MHz reference clock.

FIG. 3A shows additional details of an implementation of receiver 12 of FIG. 3. The FIG. 3A implementation has a dual-loop CDR architecture including a data recovery loop and a frequency acquisition loop for control of VCO 30 (both of these loops to be referred to as fine control loops) and an additional coarse control loop. The coarse control loop allows the PLL to achieve the target frequency despite PVT variations, while keeping the voltage-to-frequency gain of VCO 30 small. Only after both coarse control fix (in which the coarse control loop determines a coarse control voltage to cause VCO 30 to operate with an appropriate one of multiple available frequency-voltage characteristics) and frequency lock (accomplished by the frequency acquisition loop), control circuitry (with coarse control block 34) activates the data recovery loop (i.e., causes switch 35 to assert the output of charge pump circuitry 28 to low pass filter 29). This control circuitry does not reactivate the frequency acquisition loop (i.e., by causing switch 35 to assert the output of charge pump 33A to low pass filter 29) unless frequency lock is broken.

While active, the frequency acquisition loop operates (with the coarse control loop) to achieve frequency lock between the output of VCO 30 and the 156.25 MHz reference clock. More specifically, "divide by 16.5" frequency divider 32 of the frequency acquisition loop generates a frequency-divided clock in response to a clock (having frequency at least substantially equal to 2.578 GHz) output from VCO 30. When frequency lock is achieved, the output of VCO 30 has frequency 2.578 GHz, and the frequency-divided clock output from divider 32 has frequency 156.25 MHz. Before frequency lock is achieved, phase-frequency detector (PFD) 33 of the frequency acquisition loop generates control signals (identified as "up" and "dn" in FIG. 3A) indicating whether the frequency of VCO 30's output should be increased or decreased. In response to the control signals from PFD 33, charge pump 33A generates a current having magnitude for controlling the state of VCO 30. While the frequency acquisition loop is active, switch 35 passes this control current from charge pump 33A to low pass filter (LPF) 29, and LPF 29 generates a fine control voltage for VCO 30 in response to the control current. When frequency lock is achieved (and after coarse control fix), control circuitry (within coarse control circuitry 34) coupled to switch 35 places switch 35 in a state in which it decouples charge pump 33A from LPF and instead couples LPF 29 to the output of charge pump circuitry 28.

With reference again to FIG. 3A, VCO 30 is controlled to generate a multiphase clock having eight different phases. Each individual clock of this multiphase clock has frequency at least substantially equal to 2.578 GHz. Sampler 22 includes twelve identical sampling layers, and circuitry for generating from the multiphase clock (output from VCO 30) a second 2.578 GHz multiphase clock having twelve different phases. Each layer of sampler 22 operates as follows in response to a different one of the twelve individual 2.578 GHz clocks of the second multiphase clock. Sampler 22 receives a signal indicative of data having the rate 10.3125 Gb/s, and the incoming signal is asserted to each layer of sampler 22. During each cycle of the second multiphase clock (i.e., once during each period of duration (2.578 GHz)$^{-1}$), each layer of sampler 22 uses a different one of the individual clocks of the second multiphase clock to generate one sample of the incoming signal. During each cycle of the second multiphase clock, data selection circuitry within sampler 22 receives a new set of twelve samples from the twelve layers, and (once per cycle of the 2.578 GHz multiphase clock) selects a best four-sample subset (having a best one of a first phase, a second phase, and a third phase) of this set of samples (i.e., the data selection circuitry selects the first, fourth, seventh, and tenth samples of the set, or the second, fifth, eighth, and eleventh samples of the set, or the third, sixth, ninth, and twelfth samples of the set). The samples in each selected four-sample subset thus comprise a "best" sample of each of four successive bits of the incoming serial data received by sampler 22, and sampler 22 asserts to serial to parallel conversion circuitry 24 (shown in FIG. 3) a total of four recovered data bits (indicative of four successive bits of the incoming serial data) during each cycle of the 2.578 GHz clock.

Sampler 22 is implemented with a parallel architecture with a sufficient number of layers (i.e., twelve layers of sampling circuitry in a preferred implementation) so that it can operate in response to a sufficiently low frequency multiphase clock (or in other words, so that it can operate at sufficiently lower speed than if it were implemented with fewer layers). For example, a preferred twelve-layer implementation of sampler 22 asserts to circuitry 24 (of FIG. 3) a sequence of four-bit data sample words DS[0:3], each bit from a different layer of sampler 22, in response to a multiphase sampling clock having frequency F (e.g., F=2.578 GHz), thereby recovering data from the incoming signal at the same sample rate that could be attained by omitting all but three layers of sampler 22 and operating the remaining layers in response to a multiphase sampling clock having frequency 4F (e.g., 4F=10.3125 GHz) and three different phases.

As described, preferred implementations of sampler 22 implement 3×oversampling, so that sampler 22 generates twelve "candidate" samples during each cycle of the 2.578 GHz clock. While the data recovery loop of FIG. 3A is active, circuitry within sampler 22 (including binary phase detector circuitry 26 and charge pump circuitry 28) continuously operates to control the phase of the multiphase clock generated by VCO 30. Since sampler 22 generates three candidate samples for each bit period of the incoming serial data, and the phase of all three of these candidate samples depends on the phase of the multiphase clock generated by VCO 30, the middle one of each set of three candidate samples is typically selected as the "best" sample for the bit period. The four samples selected (during each cycle of the 2.578 GHz clock) from the current set of four (three-bit) candidate sample sets determine a best sample of each of the four bits determined current set of twelve candidate samples. As a result, sampler 22 outputs a "best" four-sample subset of each set of twelve candidate samples during each cycle of the 2.578 GHz multiphase clock.

Binary phase detector circuitry 26 and charge pump circuitry 28 of sampler 22 are elements of the data recovery loop of FIG. 3A. The data recovery loop is active when frequency lock has been achieved and coarse control fix has been accomplished. Binary phase detector circuitry 26 receives each set of twelve samples output from sampler 22 per cycle of the 2.578 GHz multiphase clock, and generates in response control bits "up[0:3]" and "dn[0:3]" which are indicative of whether the frequency of the multiphase clock should be increased or decreased to maintain proper alignment between the edges of the multiphase sampling clock and the transitions between bits of the incoming data (a sequence of multiphase clock frequency adjustments can maintain the average phase of each individual clock of the multiphase clock at an optimal value determined by the control bits "up[0:3]" and "dn[0:3]"). Charge pump circuitry 28 (included within charge pump and low pass filter circuitry 27) includes four identical charge pump circuits (each receiving pair, up[i] and dn[i], of the control bits, where "i"=1, 2, 3, or 4). Charge pump and low pass filter circuitry 27 also includes switch 35, and low pass filter ("LPF") 29, connected as shown. When switch 35 couples circuitry 28 to LPF 29 (i.e., when the data recovery loop is active), each of the four charge pump circuits of circuitry 28 sources or sinks a current $I_{pi}$ (where "i"=1, 2, 3, or 4) to or from the capacitors of LPF 29, to cause LPF 29 to assert to VCO 30 a low-pass-filtered "fine control" voltage (determined by the sum of the four currents $I_{pi}$ from the four charge pump circuits) to control VCO 30's generation of the multiphase sampling clock. The fine control voltage for VCO 30 is thus generated in response to the output of phase detector circuitry 26 so as to set the frequency of VCO 30's output clock at the appropriate value and maintain the average phase of VCO 30's output clock at an optimal value.

As explained, when the data recovery loop is active, the sum of the control currents generated by charge pump circuitry 28 is passed through switch 35 to LPF 29, and in response thereto, LPF 29 generates a fine control voltage for VCO 30. The data recovery loop is active only when frequency lock has been achieved. When frequency lock is lost, the data recovery loop becomes inactive, the frequency acquisition loop and coarse control loop of FIG. 3A become active, coarse control circuitry 34 causes switch 35 to couple charge pump 33A to LPF 29 and to decouple charge pump circuitry 28 from LPF, and the coarse control loop asserts an adjusted coarse control voltage (from circuit block 37 of circuitry 34) to VCO 30 in a manner to be explained below in more detail.

An implementation of the coarse control loop of FIG. 3A will be described with reference to FIGS. 4, 5A, 5B, and 6. Coarse control circuitry 34 of FIG. 3A includes frequency lock detector 36 and voltage range conditioning circuitry 37, connected as shown. Circuitry 37 includes a voltage range detector and a finite-state machine or "FSM" (within coarse control circuitry block 38 of FIG. 6). As shown in FIG. 6, circuitry 37 preferably also includes DAC 39, connected as shown between coarse control circuitry block 38 and VCO 30.

Figure 5A:
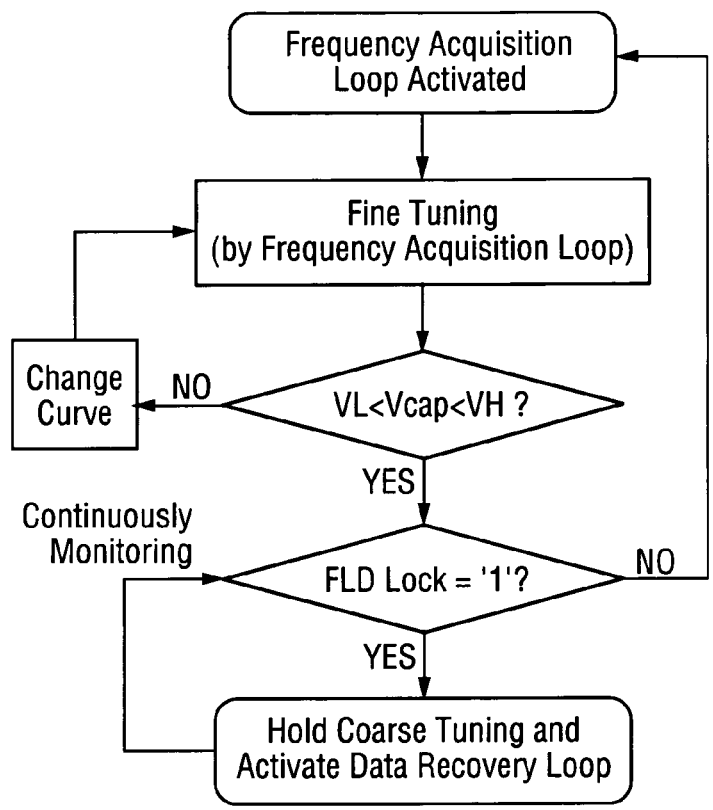
FIG. 5A is a flow chart of steps performed during typical operation of the coarse control circuitry of FIG. 3A.
Figure 6:
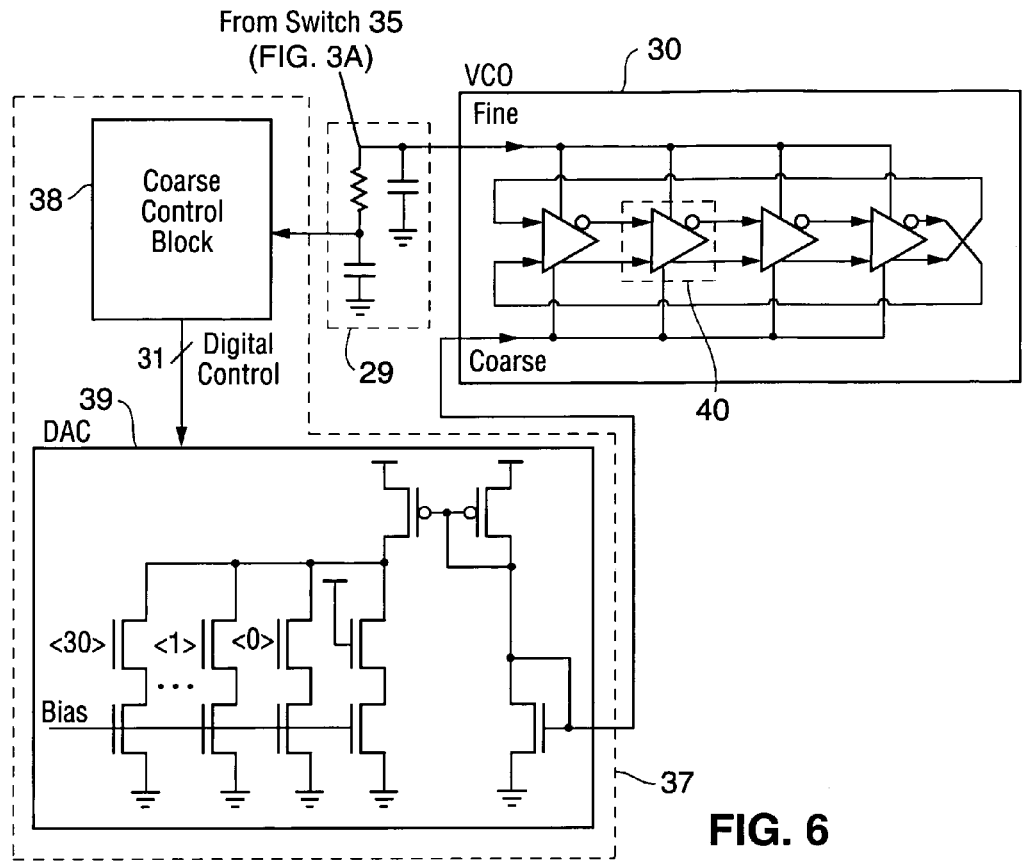
FIG. 6 is a block diagram of an embodiment of voltage range conditioning circuitry 37 of FIG. 3A, filter 29 of FIG. 3A, and an embodiment of VCO 30 of FIG. 3A.

In preferred embodiments, the coarse control loop is locked when the data recovery loop is active and active when the frequency acquisition loop is active (as indicated in FIG. 5A). In alternative embodiments, the coarse control loop is active both when the data recovery loop is active and when the frequency acquisition loop is active, except when locked in response to the output of the frequency lock detector. Only when the coarse control loop is unlocked can it change the coarse control signal that it asserts to VCO 30. When frequency lock detector 36 has locked the coarse control loop (as it does under some frequency lock conditions to be described), the coarse control signal asserted to VCO 30 does not change. In preferred embodiments, coarse control circuitry 37 of the coarse control loop continuously monitors the fine control voltage being asserted (by the data recovery loop or the frequency acquisition loop) to VCO 30, and frequency lock detector 36 continuously monitors the frequency of VCO 30's output clock (or a frequency divided version thereof) during operation of both the data recovery loop and the frequency acquisition loop.

With reference to FIG. 5A, when the coarse control loop is unlocked and voltage range monitoring logic (within circuit block 37 of the coarse control loop) determines that the fine control voltage being asserted to VCO 30 is within a predetermined range, coarse control circuitry 34 does not change the coarse control signal it asserts to VCO 30 and maintains the frequency acquisition loop in an active state (by causing switch 35 to couple charge pump 33A to LPF 29). When the coarse control loop is unlocked and voltage range monitoring logic (within circuit block 37 of the coarse control loop) determines that the fine control voltage being asserted to VCO 30 is not within the predetermined range, coarse control circuitry 34 asserts a different coarse control signal to VCO 30 and maintains the frequency acquisition loop in an active state. Coarse control circuitry 34 activates the data recovery loop and deactivates the frequency acquisition loop (by causing switch 35 to couple charge pump circuitry 28 to LPF 29) when the coarse control loop enters its "locked" state.

Voltage range monitoring logic within block 37 of coarse control circuitry 34 monitors a signal (i.e., voltage Vcap shown in FIG. 4) indicative of the fine control voltage being asserted by LPF 29 to VCO 30, and coarse control circuitry 34 uses this signal as feedback to change the coarse control signal it asserts to VCO 30. Both frequency lock detector 36 within circuitry 34 and the frequency acquisition loop monitor the output of VCO 30 (i.e., a frequency-divided version of an output clock produced by VCO 30), and the frequency acquisition loop (when active) uses this signal as feedback to change the fine control signal it asserts to VCO 30. When active, the frequency acquisition loop controls the operating point of VCO 30 along the current frequency-voltage characteristic (e.g., to move VCO 30's operating point from point P1 to point P2 along the bottom characteristic shown in FIG. 5B). To implement coarse control of the operating point of VCO 30, coarse control circuitry 34 changes the coarse control signal it asserts to VCO 30 to change VCO 30's frequency-voltage characteristic (e.g., to move VCO 30's operating point from point P2 to point P3 of FIG. 5B) without changing the fine control voltage asserted by the frequency acquisition loop to VCO 30.

Figure 4:
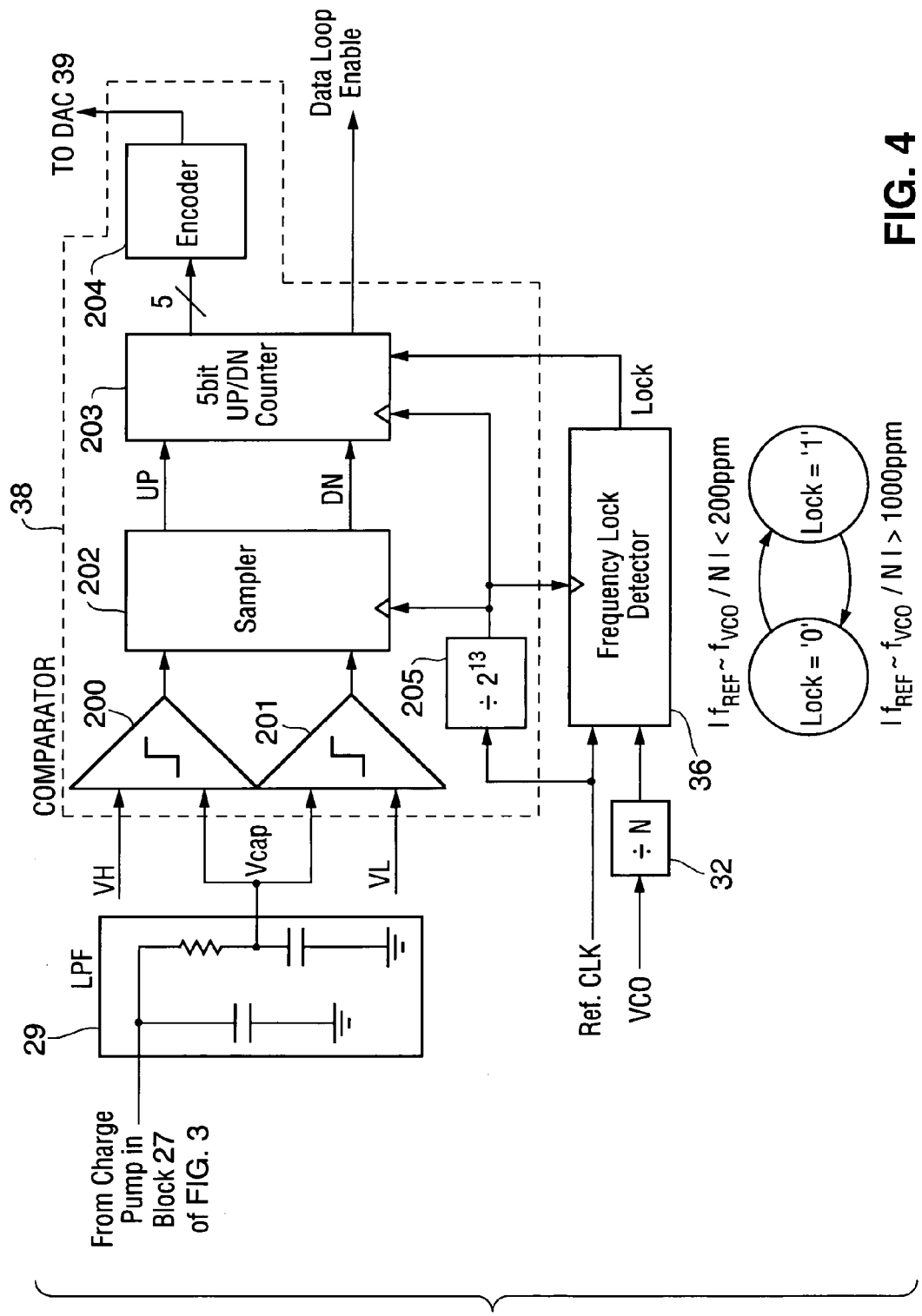
FIG. 4 is a block diagram of elements of the coarse control circuitry of FIG. 3A.

As shown in FIGS. 3A, 4, and 6, coarse control circuitry 34 preferably receives a voltage indicative of the low-pass-filtered fine control voltage being applied to VCO 30. More specifically, voltage range monitoring logic within circuitry 37 of the implementation of circuitry 34 shown in FIGS. 3A and 4 receives a voltage ("Vcap") from LPF 29 of circuitry 27 that is proportional to the low-pass-filtered fine control voltage being applied to VCO 30. Except when circuitry 37 is locked by frequency lock detector 36, the coarse control voltage generated by DAC 39 (shown in FIG. 6) of circuitry 37 is determined by the current value of the feedback signal Vcap. The lock signal asserted by frequency lock detector 36 to circuitry 37 is generated by frequency lock detector 36 in response to the 156.25 MHz reference clock and a frequency-divided version of the output of VCO 30.

Coarse control circuitry 38 of FIG. 4 is an element of circuitry 37, as shown in FIG. 6. The FIG. 4 embodiment of coarse control circuitry 38 includes voltage comparators 200 and 201, sampling circuitry 202, 5-bit Up/Down counter 203, encoder 204, and frequency divider 205, connected as shown. In operation of circuitry 38 (when the frequency acquisition loop and coarse control loop of FIG. 3A are active), voltage comparators 200 and 201 compare predetermined voltages VH and VL with a low-pass-filtered version (identified as "Vcap" in FIGS. 4 and 5A) of the fine control voltage being applied to VCO 30 by the frequency acquisition loop. The output of each of comparators 200 and 201 is sampled in sampling circuitry 202, and circuitry 202 asserts the samples to counter 203. Counter 203 includes logic for generating a five-bit control signal in response to the samples (unless counter 203 is in a locked state in response to the "lock" control bit it receives from frequency lock detector 36). The five-bit control signal generated by counter 203 determines (selects) one of the available frequency-voltage characteristics of VCO 30, and the coarse control loop controls VCO 30 to cause it to operate in accordance with the selected characteristic. Specifically, encoder 204 encodes each five-bit control signal generated by counter 203 as a 31-bit control word and asserts each 31-bit control word to DAC 39 (shown in FIG. 6). DAC 39 generates (and asserts to VCO 30) an analog coarse control voltage in response to each 31-bit control word from encoder 204. Each five-bit control signal asserted to encoder 204 by counter 203 determines a "best" one of multiple available frequency-voltage characteristics for VCO 30.

Figure 5B:
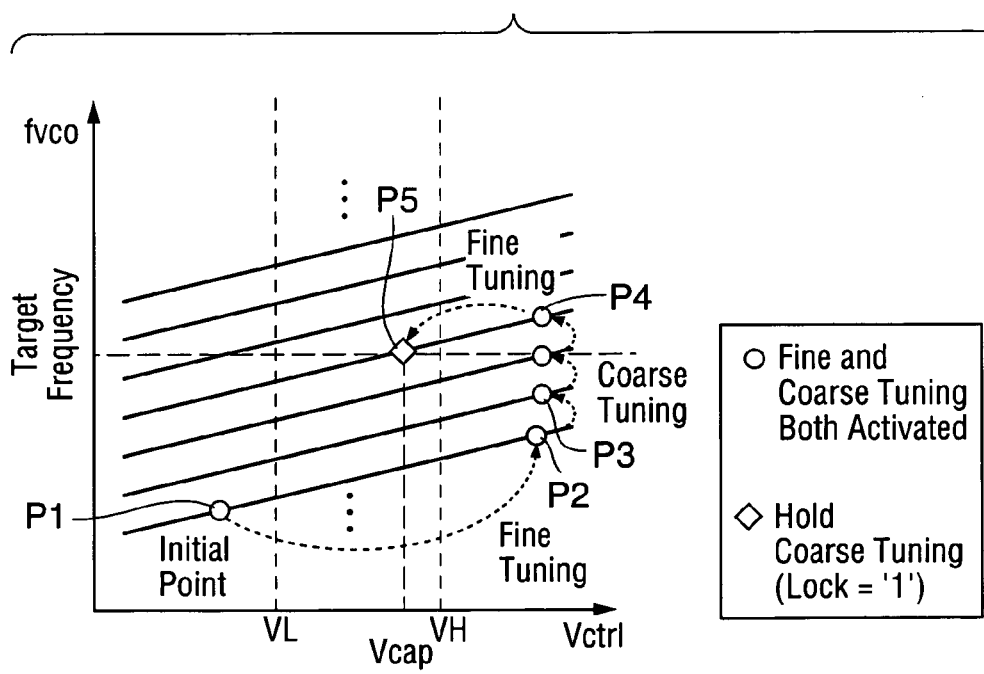
FIG. 5B is a graph of frequency versus control voltage characteristics of VCO 30 of FIG. 3A, with reference to which typical operation of the fine and coarse control circuitry of FIG. 3A is described.

With reference to FIG. 5A and FIG. 4, circuitry 38 operates as follows when the frequency acquisition loop and coarse control loop of FIG. 3A are active (and counter 203 is not locked in response to the lock bit from frequency lock detector 36):

when voltage Vcap is less than voltage VL, counter 203 asserts a five-bit control signal that selects a lower frequency-voltage characteristic for VCO 30 (this step is repeated during each cycle of counter 203 until the output frequency of VCO 30 falls sufficiently for the frequency acquisition loop to be operable to raise the output frequency of VCO 30 to the desired value without triggering a further change in the frequency-voltage characteristic);

when voltage Vcap is greater than voltage VH, counter 203 asserts a five-bit control signal that selects a higher frequency-voltage characteristic for VCO 30 (e.g., a value that moves VCO 30's operating point from point P2 to point P3 of FIG. 5B). This step is repeated during each cycle of counter 203 until the output frequency of VCO 30 rises sufficiently for the frequency acquisition loop to be operable to lower the output frequency of VCO 30 to the desired value without triggering a further change in the frequency-voltage characteristic (e.g., until counter 203 sets VCO 30's operating point at point P4 of FIG. 5B, and the frequency acquisition loop moves VCO 30's operating point from point P4 to point P5 of FIG. 5B); and when VL<Vcap<VH, the five-bit control signal output from counter 203 does not change the current frequency-voltage characteristic for VCO 30.

Frequency divider 205 (of FIG. 4) generates a clock (for clocking sampling circuitry 202, counter 203, and frequency lock detector 36) in response to a reference clock. In typical implementations, the output of frequency divider 205 has frequency equal to F/N, where N=$2^{13}$ and F is the frequency of the reference clock. Typically, the reference clock has frequency 156.25 MHz.

Frequency divider 32 (of FIGS. 3A and 4) generates a clock (for comparison with the reference clock in frequency lock detector 36) in response to VCO 30's output clock. In a typical implementation, the output of frequency divider 32 is in phase with VCO 30's output clock but has frequency equal to $F_o$/M, where M=16.5 and $F_o$ is the frequency of VCO 30's output clock. Typically, $F_o$ is equal to about (10.3125)/4 GHz=2.578 GHz.

When implemented as a "÷16.5" frequency divider, frequency divider 32 can be implemented as a "÷8.25" frequency divider (of any of the types described with reference to FIGS. 12–16) cascaded with a "÷2" frequency divider. Such an embodiment of divider 32 can be implemented using CMOS logic so as to consume very low power. Alternatively, a "÷16.5" frequency divider implementation of frequency divider 32 can be implemented as shown in (and described with reference to) FIG. 17(a), and its elements can be implemented as described with reference to FIGS. 18(a), 20, 21, and/or 22. If implemented as in FIG. 17(a) using CML logic, divider 32 requires only a two-phase input clock (the differential input signal of FIG. 17(a)) rather than a four-phase input clock (the four input signals shown in FIG. 12). However, such a CML implementation would typically consume more power than a CMOS implementation of an "÷8.25" frequency divider (of any of the types described with reference to FIGS. 12–16) cascaded with a "÷2" frequency divider.

Frequency lock detector 36 counts edges of two clocks (the reference clock whose frequency is typically equal to 156.25 MHz, and the clock output from frequency divider 32) and generates a control bit (identified as "lock" in FIG. 3A) in response to the resulting counts. If frequency lock detector 36 determines that the frequency difference between the two clocks is within a predetermined threshold (typically equal to 200 ppm), frequency lock detector 36 asserts the "lock" bit with a first value (e.g., a value indicative of a logical "1"). Otherwise, frequency lock detector 36 asserts the "lock" bit with a second value (e.g., a value indicative of a logical "0"). Detector 36 can use a first frequency difference threshold (e.g., 200 ppm, as indicated in the state diagram at the bottom of FIG. 4) for transition from the "unlock" state (in which the "lock" bit has the second value) to the "lock" state (in which the "lock" bit has the first value), and a greater frequency difference threshold (e.g., 1000 ppm, as indicated in the state diagram at the bottom of FIG. 4) for transition from the "lock" state to the "unlock" state for stable operation. In the "unlock" state, counter 203's output is free to change in response to changes in the samples asserted by sampler 202, and the FIG. 3A circuitry performs both coarse control and fine control of VCO 30's output clock frequency. In the "lock" state, logic within counter 203 fixes counter 203's output in response to the "lock" bit (thereby locking the coarse control loop of FIG. 3A), so that the FIG. 3A circuitry performs only fine control of VCO 30's output clock frequency. The lock bit asserted by detector 36 to coarse control circuitry 37 cannot falsely lock circuitry 37 when the PLL is in transient operation (i.e., when the frequency-divided version of VCO 30's output clock frequency differs by more than the relevant predetermined frequency difference threshold from the reference clock frequency). The lock bit locks coarse control (and the FIG. 3A circuitry performs only fine control of VCO 30's output clock frequency) when VCO 30's output clock frequency is locked to the target value, so that environmental changes (such as VT variation) that occur in the "lock" state cannot result in selection of a new frequency-voltage characteristic from among the multiple available characteristics. With coarse control locked, the fine control loop can utilize the full range of the selected frequency-voltage characteristic. Frequency lock detector 36 remains active at all times to monitor lock status and cause circuitry 37 to activate coarse control when frequency lock is broken. By using a frequency lock detector (e.g., detector 36) to examine VCO output frequency directly, the inventive scheme employs coarse control only when appropriate (e.g., to compensate for some temperature or supply voltage variations) and disables coarse control when appropriate so that fine control only is employed when appropriate.

With reference to FIG. 5A, when the frequency acquisition loop is active, and frequency lock detector 36 asserts its "lock" bit to counter 203 with the value "lock"=0, the frequency acquisition loop performs fine control of VCO 30 and counter 203 operates to cause the coarse control loop to a select new frequency-voltage characteristic each time Vcap leaves the range VL<Vcap<VH. When the frequency acquisition loop is active, if frequency lock detector 36 asserts its "lock" bit to counter 203 with the value "lock"=1, the output of counter 203 becomes locked (so that the coarse control loop becomes locked), and counter 203 asserts the data loop enable signal (indicated in FIG. 4) to switch 35 (shown in FIG. 3A) with a value that deactivates the frequency acquisition loop and activates the data recovery loop. While the data recovery loop is active, the data recovery loop performs fine control of VCO 30 and the coarse control loop remains locked. When the data recovery loop is active and the coarse control loop is locked, a 1-to-0 transition of the lock bit asserted to counter 203 by frequency lock detector 36 unlocks operation of counter 203 and causes counter 203 to assert the data loop enable signal (indicated in FIG. 4) to switch 35 (shown in FIG. 3A) with a value that activates the frequency acquisition loop and deactivates the data recovery loop.

In cases in which the power supply voltage asserted to the FIG. 4 circuitry is low, care must be taken to choose appropriate values for the voltages VH and VL asserted to comparators 200 and 201 of FIG. 4. A narrower span between VH and VL results in longer search time. Also, since adjacent ones of the available frequency-voltage characteristics must overlap in this span, a narrower span between VH and VL increases the number of frequency-voltage characteristics curves that must be available to cover the whole operating range. Wider span between VH and VL provides shorter search time but results in narrower operating range along each frequency-voltage characteristic. Also, wider span between VH and VL narrows the range outside of this span that is used (by the fine control loop) to compensate for voltage and temperature variation while the VCO output is locked to the target frequency.

Figure 7:
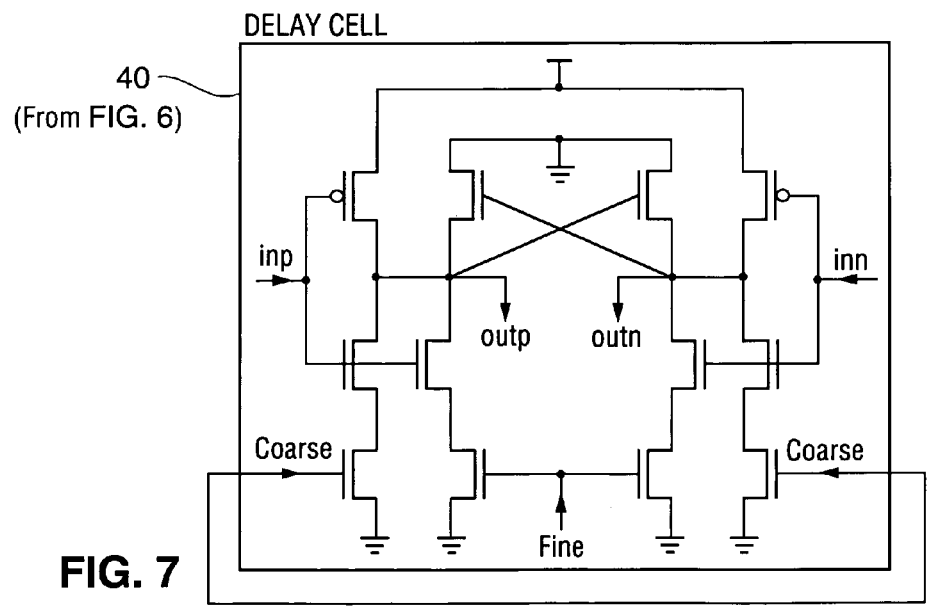
FIG. 7 is a block diagram of an embodiment of a delay cell of the FIG. 6 embodiment of VCO 30.

FIGS. 6 and 7 show a preferred implementation of VCO 30 of FIGS. 3 and 3A, and elements of a preferred implementation of the coarse control loop for such VCO. To cover an adequate range of PVT variation while maintaining sufficiently small Kvco and providing sufficient overlap between the selectable frequency-voltage characteristics of VCO 30, the coarse control loop and VCO of FIGS. 6 and 7 are implemented so that VCO 30 can operate in accordance with any selected one of thirty-two discrete frequency-voltage characteristics (with each 31-bit control word asserted to DAC 39 of FIG. 6 from coarse control block 38 determining one of these characteristics). To prevent unwanted dead frequency zones (not covered by any of the frequency-voltage characteristics), a thermometer code scheme is used instead of a binary weighted current switch, because current switches of different size can be more prone to suffer from random device mismatch.

FIG. 7 shows the circuit details of each delay cell 40 used in a preferred ring OSC implementation (shown in FIG. 6) of VCO 30 of FIGS. 3 and 3A. Instead of implementing each delay cell 40 of the ring OSC to include segmented MOS switches to allow the ring OSC's frequency-voltage characteristic to be controlled (as described, for example, in S. J Song et al., "A 4-Gb/s CMOS Clock and Data Recovery Circuit Using ⅛-Rate Clock Technique," *IEEE J. Solid-State Circuits*, vol. 38, pp. 1213–1219, July 2003), the FIG. 6 circuit uses shared DAC 39 to generate an analog coarse tuning voltage from the digital control bits output from coarse control block 38. DAC 39 includes thirty-one transistors, each functioning as a switch to control the analog output of DAC 39, with the gate of each transistor being controlled by a different bit of each 31-bit control word output from block 38. Use of DAC 39 simplifies the individual delay cell circuitry within the ring OSC and reduces routing complexity, since a segmented switch array is built only once (within DAC 39; not within each delay cell of the ring OSC) and each delay cell needs only one or two additional transistors for the analog coarse control input (e.g., delay cell 40 of FIG. 6 can be implemented as shown in FIG. 7, with the analog coarse control voltage "coarse" produced by DAC 39 asserted to the gate of each of two NMOS transistors).

With a segmented switch in each delay cell of a ring OSC, the area of the ring OSC can be too big and it can be too hard to maintain the symmetry needed within the ring OSC that is needed to maintain multi-phase evenness. The size of each switch in DAC 39 should be carefully designed to make the frequency-voltage characteristics (each determined by and resulting from a particular value of the 31-bit control word output from block 38) have enough overlap and be distributed evenly. Since the analog coarse control voltage generated by DAC 39 still has large Kvco, special care will typically need to be taken to ensure adequate shielding and decoupling capacitance for this analog coarse control signal.

Figure 8:
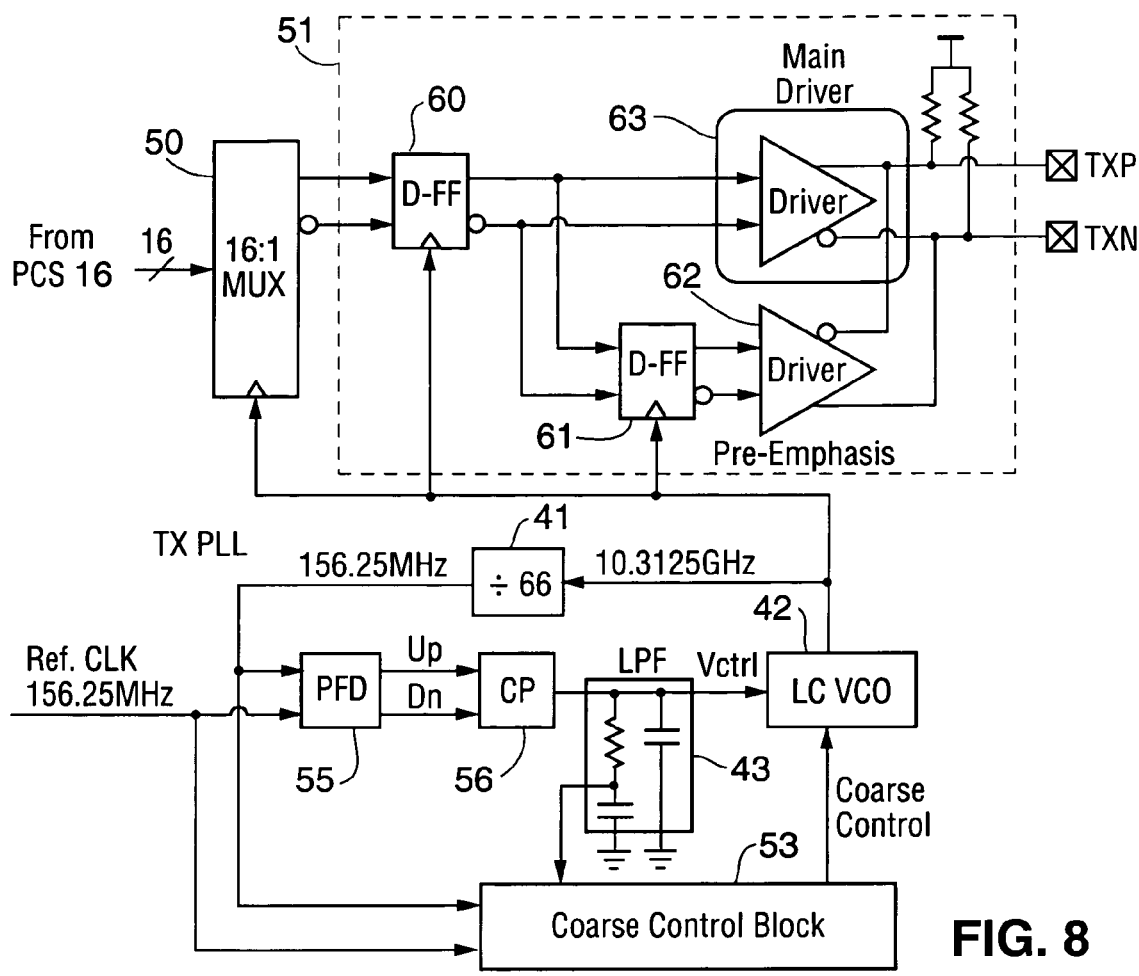
FIG. 8 is a block diagram of elements of an implementation of circuitry 14 (which is a 10.3125 Gb/s transmitter) of FIG. 3.
Figure 9:
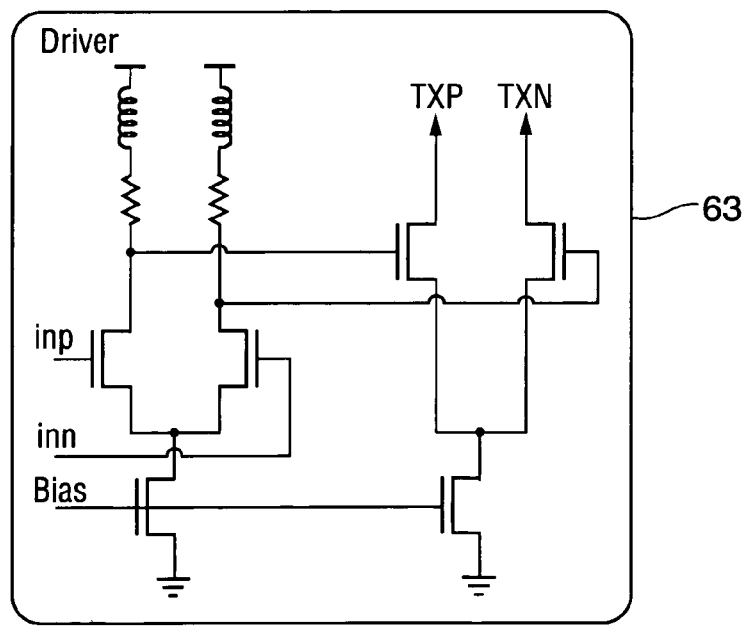
FIG. 9 is a schematic diagram of driver 63 of FIG. 8.
Figure 10:
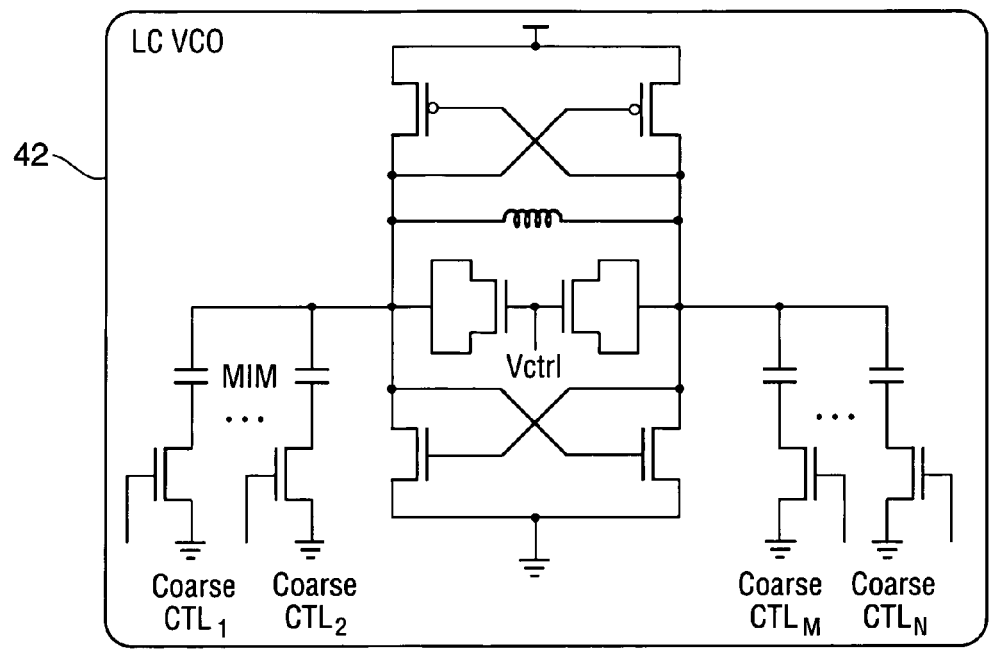
FIG. 10 is a schematic diagram of VCO 42 of FIG. 8.

FIG. 8 is a block diagram of elements of an implementation of 10.3125 Gb/s transmitter circuitry 14 of FIG. 3. FIG. 9 is a schematic diagram of driver 63 of FIG. 8. FIG. 10 is a schematic diagram of VCO 42 of FIG. 8. The serialized data generated by multiplexer 50 of FIG. 8 are retimed at a 10.3125 GHz full-rate clock and the PLL employs LC-VCO 42 (rather than a ring OSC) for low jitter. Since positioning the output frequency of LC-VCO 42 precisely at 10.3125 GHz is difficult given the uncertainty in process parameters, the FIG. 8 circuitry applies a coarse control scheme as well as a fine control scheme. The coarse control of the LC-VCO frequency can be accomplished by controlling a segmented array of capacitors. Such an array of capacitors is described, for example, in J. Cao et al., "OC-192 Transmitter and Receiver in Standard 0.18-μm CMOS,"
*IEEE J. Solid-State Circuits*, vol. 37, pp. 1768–1780, December 2002. The algorithm to find the proper coarse control settings is similar to that of the 10 Gb/s CDR. The output drivers of the 10 Gb/s transmitter have a pre-emphasis function to mitigate inter-symbol interference (ISI).

10 Gb Ethernet transceiver chip 10 of FIG. 3 can be fabricated using a 0.13 μm CMOS process in such a manner that it dissipates 898 mW from a single 1.2V supply during operation.

LC VCO 42 of FIG. 8 is controlled to output a full rate (10.3125 GHz) clock, to avoid deterministic jitter caused by duty cycle distortion that would otherwise result if LC VCO 42 were controlled to output a half-rate clock. In FIG. 8, parallel to serial data conversion circuit 50 (which is a 16:1 MUX) receives sixteen-bit words of encoded data from PCS circuitry 16 of FIG. 3. The stream of serial data and its complement that are output from conversion circuit 50 are retimed by the full rate clock from VCO 42 to further reduce jitter from the MUX states. Transmitter circuitry 51 puts the serialized data output from circuit 50 into form for transmission as a differential signal over a serial link. Circuitry 51 includes flip-flops 60 and 61, main driver 63, and pre-emphasis driver 62, connected as shown.

The PLL of FIG. 8 controls LC VCO 42 to cause it to generate the 10.3125 GHz clock in response to a 156.25 MHz reference clock. Since a tail current source in a LC VCO would be a major source of flicker noise that could degrade performance, a preferred implementation of LC VCO 42 (e.g., that shown in FIG. 10) does not have a tail current transistor. Without a tail current source, the swing of VCO 42 can be maximized. It is desirable for it to have large swing because phase noise is quadratically inversely proportional to the magnitude of the swing.

For fine control of LC VCO 42, the output of LC VCO 42 is frequency divided in "divide by 66" frequency divider 41, and the output of divider 41 (with the reference clock) are asserted to the inputs of phase-frequency detector (PFD) 55. The up and down control bits generated by PFD 55 are asserted to charge pump 56. The output of charge pump 56 is low pass filtered in filter 43, and the output of filter 43 is employed as the fine control voltage (labeled "$V_{CTRL}$" in FIG. 10) of LC VCO 42.

To implement coarse control of LC VCO 42, LC VCO 42 includes a metal-insulator-metal (MIM) capacitor array (identified as "MIM" in FIG. 10) and the coarse control algorithm implemented in preferred embodiments of receiver 12 can be used to generate the coarse control voltages that control the MIM capacitor array. Specifically, the output of LC VCO 42 is frequency divided in "divide by 66" frequency divider 41, and the output of divider 41 is employed as one of the inputs to a frequency lock detector (which can be identical to lock detector 36 of FIG. 3A) within coarse control block 53. The 156.25 MHz reference clock is the other input to the frequency lock detector within block 53. Voltage range conditioning circuitry within block 53 (which can be identical to circuitry 37 of FIG. 3A) receives the output of low pass filter 43, the "lock" control bit generated by the frequency lock detector (within block 53), and reference voltages VH and VL (not shown in FIG. 8), and generates the coarse control voltages (labeled "Coarse $CTL_1$," "Coarse $CTL_2$," . . . , "Coarse $CTL_M$," and "Coarse $CTL_N$" in FIG. 10) in response thereto. Though the operating range of the MOS varactor within LC VCO 42 is predictable, a frequency lock detector (which can be identical to that within coarse control circuitry 34 of FIG. 3) is preferably included within coarse control block 53 to ensure proper locking.

For power optimization without sacrificing performance, parallel to serial data conversion circuit 50 of FIG. 8 can be implemented as a 16:8 MUX (implemented with CMOS logic) and a 8:1 MUX (implemented with CML) coupled to receive the output of the 16:8 MUX, and driver stages 62 and 63 are implemented with CML. When enabled, driver 63 of FIG. 8 can provide pre-emphasis (up to 20%) to mitigate inter-symbol-interference. Inductive peaking is preferably used to extend the bandwidth of pre-emphasis driver 63.

Figure 17A:
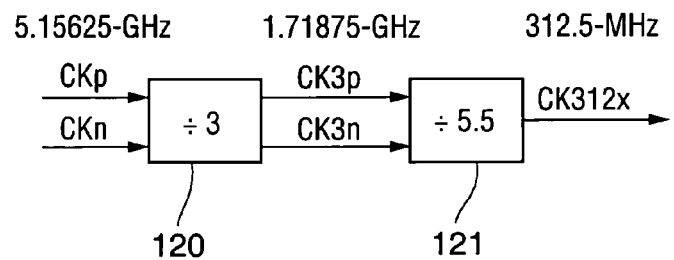
FIG. 17(a) is a simplified block diagram of a ÷16.5 frequency divider that can be employed in the FIG. 3 transceiver (e.g., to implement frequency divider 32 of FIG. 3A and FIG. 4). The frequency divider of FIG. 17(a) includes ÷3 frequency divider 120, and ÷5.5 frequency divider 121 coupled to receive the differential output of ÷3 divider 120.

FIG. 17(a) is a simplified block diagram of an embodiment of a ÷16.5 frequency divider that can be employed in the FIG. 3 transceiver (e.g., to implement frequency divider 32 of FIG. 3A and FIG. 4). The frequency divider of FIG. 17(a) includes ÷3 frequency divider 120, and ÷5.5 frequency divider 121 coupled to receive the differential output (CK3p and CK3n) of circuit 120. Preferably, circuit 121 outputs a single ended clock signal CK312x having frequency 312.5 MHz in response to a 5.15625 GHz differential clock signal (CKp and CKn) at the inputs of circuit 120. Alternatively, circuit 121 produces a differential output clock signal having frequency f/(16.5) in response to a differential clock signal having frequency "f" at the inputs of circuit 20.

Figure 17B:
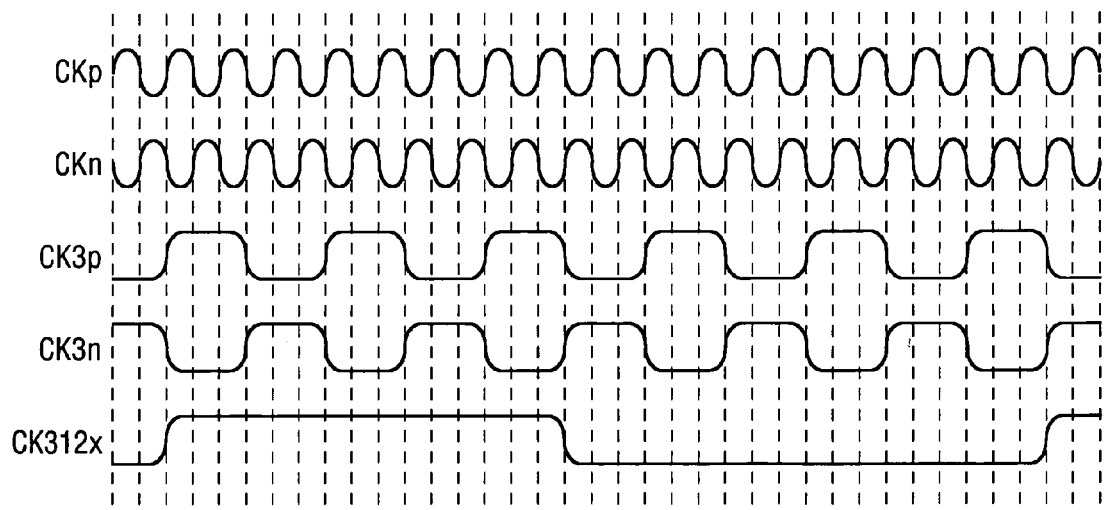
FIG. 17(b) is a timing diagram of signals received or generated by the FIG. 17(a) circuit.

FIG. 17(b) is a timing diagram of signals received or generated by the FIG. 17(a) circuit.

The FIG. 17(a) circuit has a cascaded structure in which ÷3 frequency divider circuit 120 produces a differential output clock signal whose frequency is f/(3) in response to a differential clock signal having frequency "f" at the inputs of circuit 120, and ÷5.5 frequency divider circuit 121 produces an output clock signal having frequency f/(16.5) in response to a differential clock signal having frequency "f/3" received from circuit 120. In response to an input having frequency 5.15625 GHz, ÷3 divider 120 generates 1.71875 GHz differential clocks, CK3p and CK3n. As will be described with reference to the FIG. 21(a) embodiment of circuit 121, DTFFs are preferably utilized to implement circuit 121, so that circuit 121 can have simple design and be capable of high-speed operation. In preferred embodiments in which frequency divider 121 utilizes both positive and negative edges of CK3p and CK3n, frequency divider 120 is preferably designed carefully so that CK3p and CK3n have a 50% duty cycle as shown in FIG. 17(b) or a duty cycle at least substantially equal to 50%.

Figure 18A:
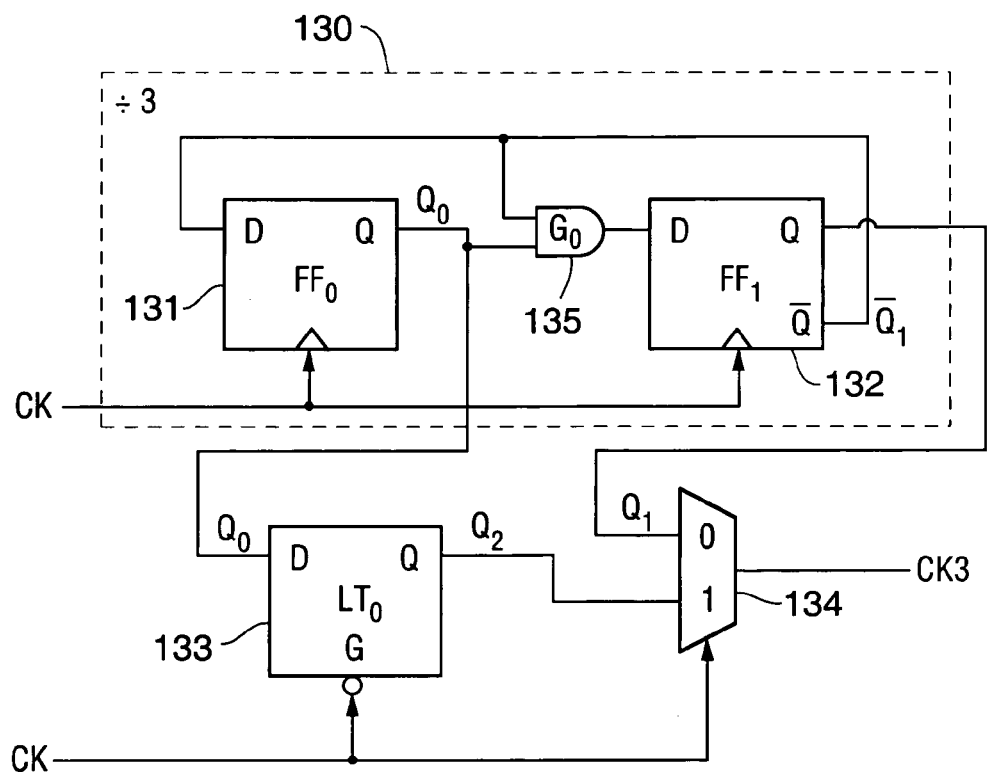
FIG. 18(a) is a simplified schematic diagram of a portion of an embodiment of the ÷3 frequency divider of FIG. 17(a), including a conventional ÷3 frequency divider (block 130) implemented using single-edge-triggered flip-flops ("STFFs") 131 and 132, and additional elements (133 and 134) connected as shown.
Figure 18B:
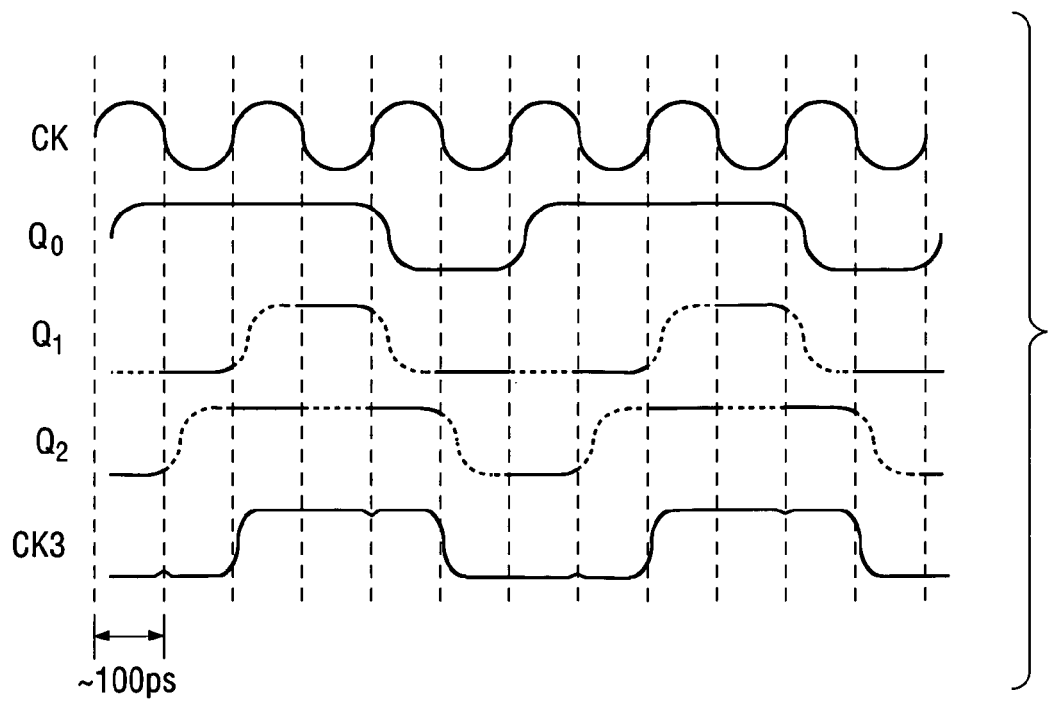
FIG. 18(b) is a timing diagram of signals received or generated by the FIG. 18(a) circuit.

FIG. 18(a) is a simplified schematic diagram of a preferred embodiment of a portion of ÷3 divider 120 of FIG. 17(a). The FIG. 18(a) circuit includes conventional ÷3 frequency divider 130 implemented using AND gate 135 and single-edge-triggered flip-flops ("STFFs") 131 and 132, connected as shown. The FIG. 18(a) circuit also includes negative level-sensitive latch ("LT$_0$") 133 and multiplexer 134, connected as shown. FIG. 18(b) is a timing diagram of signals received or generated by the FIG. 18(a) circuit.

A preferred embodiment of the FIG. 18(a) circuit generates a differential output in response to a differential input (i.e., signal CK3 of FIG. 18(a) represents both CK3p and CK3n of FIG. 17(a) and input CK of FIG. 18(a) represents both CKp and CKn of FIG. 17(a)). In such preferred embodiment, each of a CML implementation of flip-flop 131 and a CML implementation of flip-flop 132 is clocked by differential clock signals CKp and CKn but only one of the clocks CKp and CKn is shown in FIG. 3(a) identified as "CK," the CML implementation of flip-flop 132 asserts differential output signals $Q_1$ and $\sim Q_1$ to multiplexer 134 but these differential output signals are shown (for simplicity) in FIG. 18(a) as a single signal $Q_1$ asserted to an input of multiplexer 134, and a CML implementation of flip-flop 133 asserts differential output signals $Q_2$ and $\sim Q_2$ to multiplexer 134 but these differential output signals are shown (for simplicity) in FIG. 18(a) as a single signal $Q_2$ asserted to an input of multiplexer 134. In alternative embodiments, ÷3 divider 120 of FIG. 17(a) could include two copies of a single-ended implementation of the FIG. 18(a) circuit connected in parallel: one for generating output CK3p in response to input CKp; the other for generating output CK3n in response to input CKn.

The FIG. 18(a) circuit is a high-speed, divide-by-3 circuit. Flip-flops 131 and 132 together with AND gate 135 to create three states of signal pair $Q_0$ and $Q_1$. However, since the duty cycle of each of signals $Q_0$ and $Q_1$ is far from 50% as shown in FIG. 18(b), elements 131, 132, and 135 alone are not suitable for generating the clock (CK3p and CK3n) input to ÷5.5 divider 121 of FIG. 17(a). To solve this problem, negative level-sensitive latch ("LT$_0$") 133 is coupled to the output of flip-flop 131 as shown in FIG. 18(a), to generate differential signal $Q_2$ in response to differential signal $Q_0$, and multiplexer 134 is coupled to receive signal $Q_2$ at one of its inputs and differential signal $Q_1$ at its other input. MUX 134 (and each of elements 131, 132, and 133) is clocked by the input clock CK (CKp and CKn of FIG. 17(a)) to assert at its output the signal CK3 (CK3p and CK3n) in response to its inputs. The waveform of one of CK3p and CK3n is labeled as "CK3" at the bottom of FIG. 18(b), and the waveform of the other one of CK3p and CK3n is the inverse thereof.

Latch 133 passes signal $Q_0$ to its output when clock CK (i.e., clock CKp and CKn) is low. When CK is high, the output of latch 133 (signal $Q_2$) is held. MUX gate 134 selects signals $Q_1$ and $Q_2$ alternately according to CK. Those selections are indicated as the solid lines on the waveforms of $Q_1$ and $Q_2$ in FIG. 18(b). Although the signal integrity of input clock CK is typically carefully dealt with, its duty cycle can be distorted and such duty cycle distortion can distort the duty cycle of output clock CK3 (i.e., clock CK3p and CK3n). However, such duty cycle distortion of output CK3 is threefold reduced. For example, if input clock CK has a 10% distortion, CK3 will have a 3.3% distortion, resulting in a 46.7% duty cycle.

The ÷3 divider of FIG. 17(a) (e.g., the FIG. 18(a) embodiment of divider 120 of FIG. 17(a)) is preferably implemented using CML gates in a 0.13 μm CMOS technology. In such a preferred implementation of the FIG. 17(a) circuit, all gates have differential signaling although only the positive (or negative) signal is drawn in FIG. 18(a) for simplicity (for example, a CML implementation of flip-flop 131 is clocked by differential clock signals CKp and CKn, but only one of these clocks is shown in FIG. 18(a) identified as "CK", and a CML implementation of flip-flop 131 asserts differential output signals $Q_{0p}$ and $Q_{0n}$, but only one of these is shown in FIG. 18(a) identified as "$Q_0$"). Simulations of such a CML gate implementation of FIG. 18(a), assuming a differential input clock having frequency 5.15625 GHz, show that the gate delays and the clock-to-output delays are less than 40 ps in the worst process, voltage, and temperature (PVT) condition and their nominal delays are about 25 ps. Based on the simulation results, the circuit can be implemented so that it does not have any critical path for 5.15625 GHz operation.

In preferred embodiments in which the ÷3 divider of FIG. 17(a) has a differential output having a duty cycle at least substantially equal to 50%, the ÷5.5 divider of FIG. 17(a) fully utilizes double-edge-triggered flip-flops (DTFFs) implemented as CML circuitry. For example, the ÷5.5 divider can have a simple design (including DTFFs) that is similar to the design of a ÷11 divider implemented with a single-edge-triggered flip-flop in place of each DTFF.

Figure 19A:
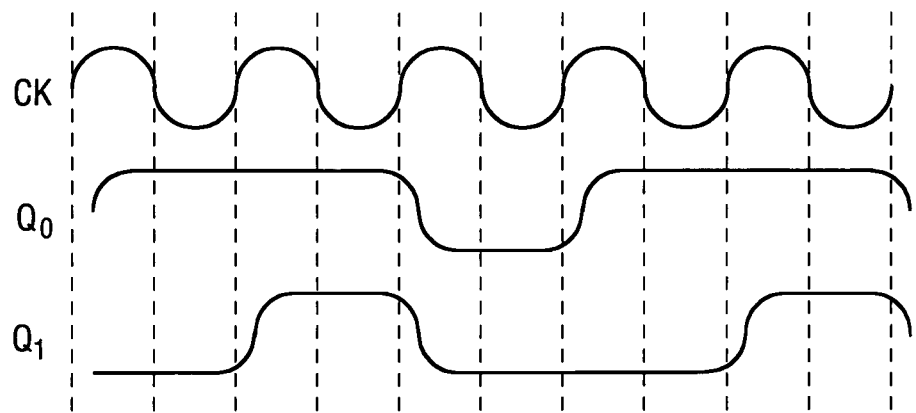
FIG. 19(a) is a timing diagram of signals received or generated by a conventional ÷3 frequency divider (i.e., block 130 of FIG. 18(a)).
Figure 19B:
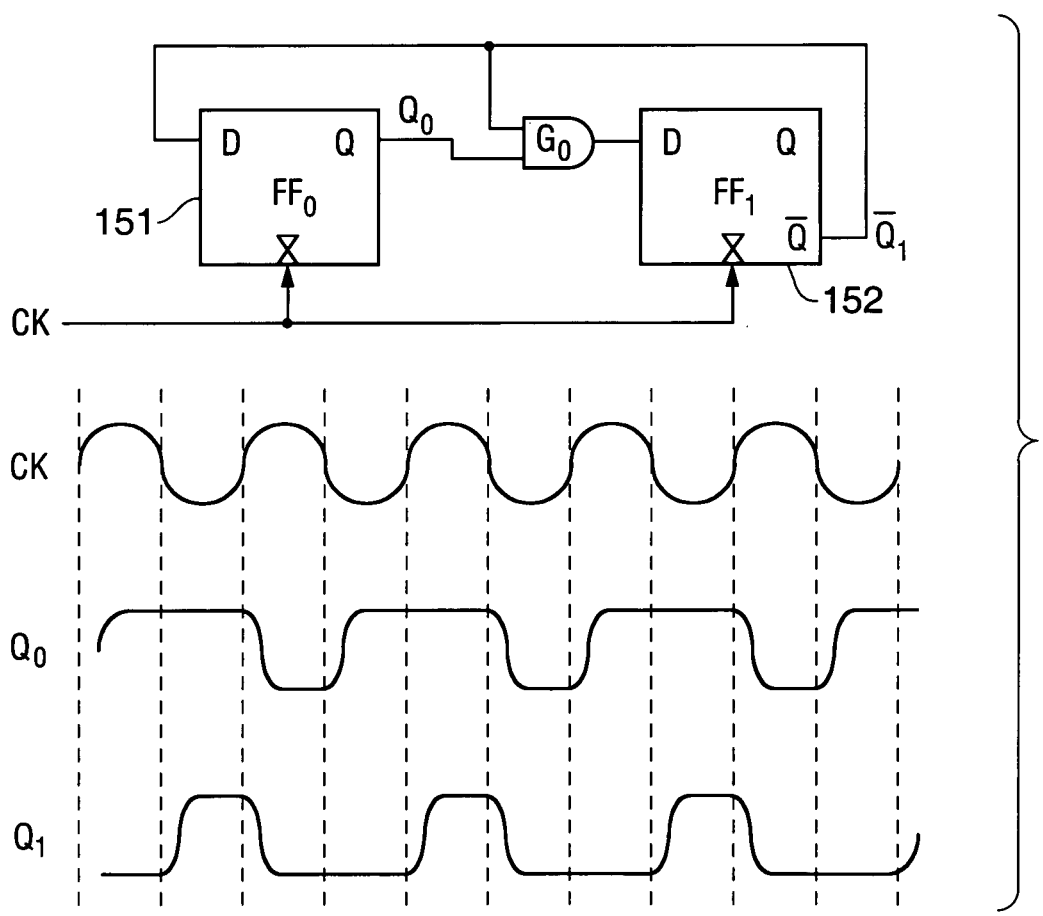
FIG. 19(b) is a block diagram of a conventional ÷1.5 frequency divider having the same structure as block 130 of FIG. 18(a) but implemented using double-edge-triggered flip-flops ("DTFFs") instead of STFFs 131 and 132 of FIG. 18(a).

To understand the reason for this, one should recognize that if a DTFF is used instead of a single-edge-triggered flip-flop (STFF) in a frequency divider, a multiply-by-2 effect can occur, resulting in divide-ratio reduction by 2. For example, a divide-by-3 circuit (e.g., circuit 130 of FIG. 18(*a*)) can function as a divide-by-1.5 circuit (e.g., one whose waveforms are as shown in FIG. 19(*b*)) if STFFs of the divide-by-3 circuit are replaced by DTFFs. Thus, for example, the divide-by-1.5 circuit of FIG. 19(*b*) differs from divide-by-3 circuit 130 of FIG. 18(*a*) only in that DTFFs 151 and 152 of FIG. 19(*b*) replace STFFs 131 and 132 of circuit 130 of FIG. 18(*a*). However, the clock duty-cycle of each DTFF should be close to 50% to guarantee that the related combinational-logic has enough time to operate during both the clock high and the clock low cycles.

Figure 20:
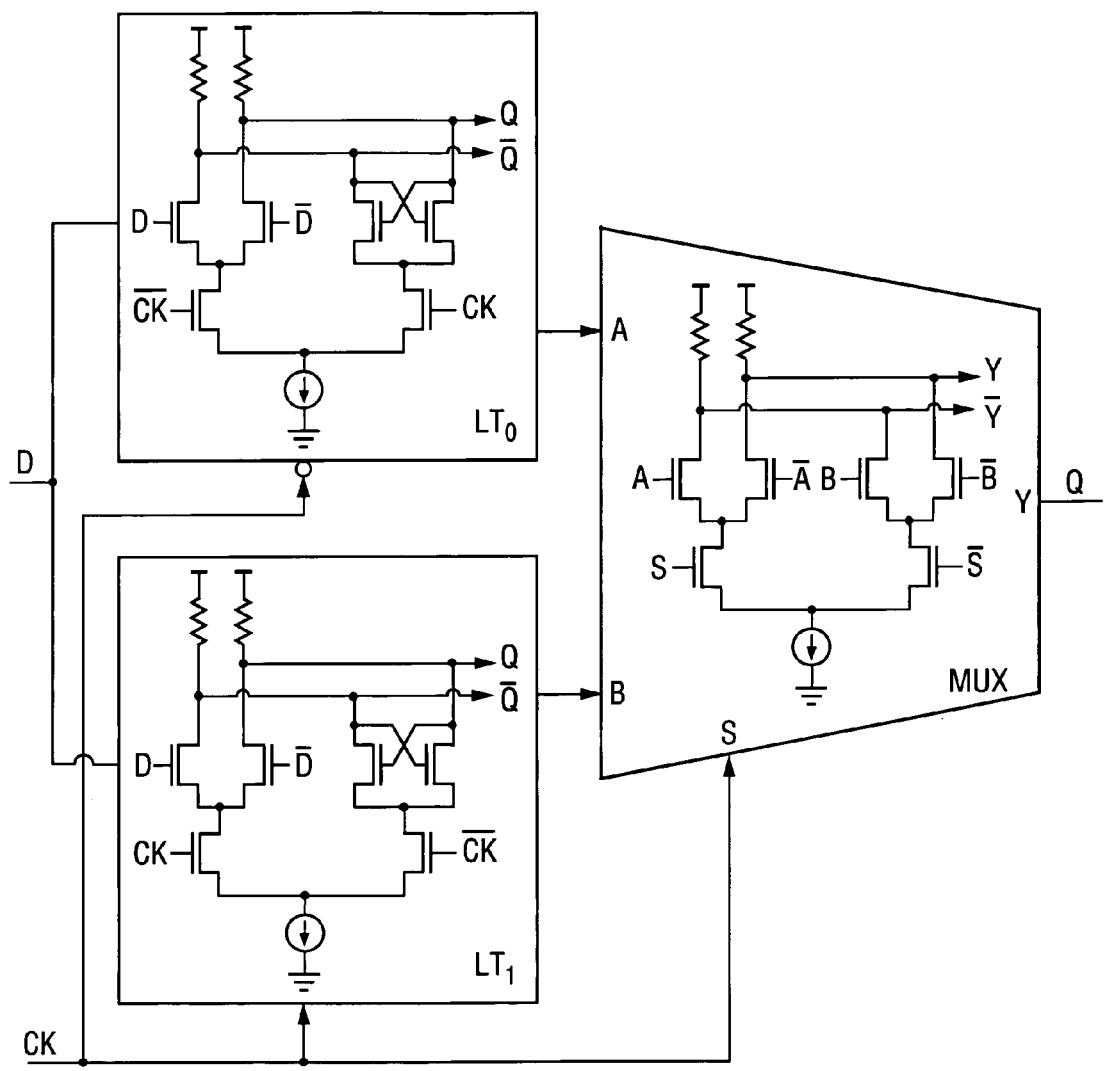
FIG. 20 is a schematic diagram of a DTFF that can be used in an implementation of the ÷5.5 frequency divider of the ÷16.5 frequency divider of FIG. 17(a).

FIG. 20 is a schematic diagram of a DTFF that can be used in a preferred implementation of the ÷5.5 divider of the ÷16.5 divider of FIG. 17(*a*). The DTFF of FIG. 20 includes two level-sensitive latches (LT$_0$ and LT$_1$) and a MUX gate (coupled to receive the outputs of latches LT$_0$ and LT$_1$), all implemented as CML circuitry. The MUX gate is switched by a differential input clock (which is output from the ÷3 divider when the FIG. 20 circuit is included in the ÷5.5 divider of the ÷16.5 divider of FIG. 17(*a*)) so as always to select the latch that is holding sampled data. In terms of integrated circuit area, only one MUX gate must be added to implement the DTFF of FIG. 20 (in comparison with the integrated circuit area of a STFF circuit, assuming as is typical that the STFF circuit comprises two latches).

HSPICE simulations have been performed on a toggle flip-flop having the FIG. 20 design, with the negative output directly connected to the positive input. The results show that this CML-type DTFF can operate properly in response to an input clock having frequency greater than 8 GHz even assuming the worst PVT condition.

If implemented using DTFFs, a frequency divider with eleven states can act as a ÷5.5 divider. For eleven states, at least four flip-flops are required together with combinational-logic gates. For example, the ÷5.5 frequency divider of FIG. 21(*a*) has eleven states and includes four pipelined DTFFs (140, 141, 142, and 143), and is an embodiment of ÷5.5 frequency divider 121 of FIG. 17(*a*). FIG. 21(*b*) is a state diagram for the FIG. 21(*a*) circuit. FIG. 22 is a simplified schematic diagram of an implementation of each of DTFF circuits 140, 141, 142, and 143 of FIG. 21(*a*).

In order to reduce the delay of each pipeline stage of the FIG. 21(*a*) circuit, the gates are configured with three additional flip-flops (DTFFs 144, 145, and 146) connected with four AND gates and two OR gates as shown in FIG. 21(*a*). Each of DTTFFs 140, 141, 142, and 143 of FIG. 21(*a*) is preferably implemented as shown in FIG. 22, with MUX gate 170 controlled by the signal asserted to enable node "E" (enable node "E" of each of DTFFs 140, 141, 142, and 142 is indicated in FIG. 21(*a*)) and data node "D" of flip-flop 171 coupled to receive the output of MUX 170. Flip-flop 171 of FIG. 22 is preferably implemented as a DTFF having the design shown in FIG. 20. With each of DTFFs 140, 141, 142, and 143 of FIG. 21(*a*) implemented as shown in FIG. 22 (with flip-flop 171 implemented as shown in FIG. 20), and each of DTFFs 144, 145, and 146 of FIG. 21(*a*) implemented as shown in FIG. 20, the maximum number of gates in each pipeline stage of the FIG. 21(*a*) circuit is limited to two in order to guarantee high-speed operation during both clock high and clock low cycles.

The desired eleven states of the FIG. 21(*a*) circuit are indicated in FIG. 21(*b*) and are chosen among the sixteen states generated by flip-flops 140, 141, 142, and 143. In operation, the FIG. 21(*a*) circuit cycles through the eleven states shown in FIG. 21(*b*), and the other five states (from 1011 to 1000) are skipped. As a result, signal Q3 has six continuous 0's and five continuous 1's alternately, and thus has a duty cycle of about 50% (more precisely, its duty cycle is 45.5%=5/11).

In preferred implementations of FIG. 21(*a*), all gates have differential signaling although only the positive signals, and one negative signal (the input ~Q$_3$ to converter 147), are drawn in FIG. 21(*a*) for simplicity. For example, the CML implementation of flip-flop 143 is clocked by differential clock signals CK3*p* and CK3*n*, (received from the ÷3 frequency divider) but only one of these clocks is shown in FIG. 21(*a*) identified as "CK3", and the CML implementation of flip-flop 143 asserts differential output signals Q$_3$ and ~Q$_3$, but only one of the outputs of flip-flop 143 (the output signal Q$_3$, which is asserted to one input of converter 147) is shown in FIG. 21(*a*). The other output of the CML implementation of flip-flop 143 would assert the signal ~Q$_3$ to converter 147's other input.

Differential-to-single-ended-signal converter 147 generates a single-ended output clock ("CK312*x*") in response to the differential signals Q$_3$ and ~Q$_3$ asserted thereto by flip-flop 143. In embodiments in which the differential clock signals CK3*p* and CK3*n*, received by the FIG. 21(*a*) circuit (from the ÷3 frequency divider) have the frequency 1.71875 GHz, the output clock CK312*x* has the frequency 312.5 MHz. The device sizes of converter 147 should be tuned so that the duty cycle of its output, CK312*x*, is about 50% (e.g., about 47%)

Since the FIG. 21(*a*) embodiment of ÷5.5 divider circuit 121 (of FIG. 17(*a*) has seven flip-flop outputs, Q$_0$, Q$_1$, Q$_2$, Q$_3$, X, SKIP, and EN, the initial state of this circuit can be any of $2^7$(=128) states at power-up. Verifications using a model checker have shown that each of the 128 states will converge to one of the eleven states of FIG. 21(*b*), and once the FIG. 21(*a*) circuit enters one of the eleven states of FIG. 21(*b*) it will never diverge from the eleven states of FIG. 21(*b*).

It should be understood that while some embodiments of the present invention are illustrated and described herein, the invention is not to be limited to the specific embodiments described and shown.

What is claimed is:

1. A PLL circuit, including:
   a multi-range VCO configured to generate a clock, having a clock frequency, in response to a fine control signal and a coarse control signal;
   at least one fine control loop configured to generate the fine control signal; and
   a coarse control loop configured to generate the coarse control signal, wherein the coarse control loop includes a frequency lock detector and voltage range monitoring logic, the frequency lock detector is configured to generate a lock signal in response to determining that the difference between the clock frequency and a reference frequency has decreased to within a predetermined threshold, and the coarse control loop is configured to enter a locked state in response to the lock signal.

2. The PLL circuit of claim 1, wherein the fine control signal is a fine control voltage, the coarse control loop is operable in an unlocked state to generate the coarse control signal, the voltage range monitoring logic is operable to determine whether the fine control voltage is within a predetermined voltage range, and the coarse control signal generated in the unlocked state has a value determined at least in part by a signal generated by the voltage range monitoring logic.

3. The PLL circuit of claim 2, wherein the VCO is operable with different frequency-voltage characteristics in response to different values of the coarse control signal, a current frequency-voltage characteristic of the VCO is determined by a current value of the coarse control signal, and the coarse control loop in the unlocked state is configured to change the value of the coarse control signal to compensate for at least one environmental change that affects the current frequency-voltage characteristic.

4. The PLL circuit of claim 2, wherein the frequency lock detector includes frequency lock monitoring logic, the VCO is operable with different frequency-voltage characteristics in response to different values of the coarse control signal, a current frequency-voltage characteristic of the VCO is determined by a current value of the coarse control signal, and the coarse control loop implements a robust digital coarse control algorithm that employs the frequency lock monitor logic and the voltage range monitoring logic to avoid unnecessarily changing the current frequency-voltage characteristic while controlling the VCO to compensate for environmental changes not affirmatively caused by the coarse control loop.

5. The PLL circuit of claim 1, wherein the VCO is operable with different frequency-voltage characteristics in response to different values of the coarse control signal, a current frequency-voltage characteristic of the VCO is determined by a current value of the coarse control signal, and the fine control loop is configured to generate the fine control signal to control the VCO without changing the current frequency-voltage characteristic.

6. The PLL circuit of claim 1, wherein the VCO is a ring oscillator including delay cells connected in a ring structure.

7. The PLL circuit of claim 6, wherein the PLL circuit is an element of a data sampler, and the clock is a sampling clock.

8. The PLL circuit of claim 1, wherein the coarse control signal is a coarse control voltage, and the coarse control circuitry includes:
circuitry configured to generate coarse control bits; and
a DAC for generating the coarse control voltage in response to the coarse control bits.

9. A data sampling circuit including:
sampling circuitry configured to sample a signal indicative of data;
a PLL circuit coupled to the sampling circuitry and configured to generate a sampling clock having a clock frequency and to assert the sampling clock to the sampling circuitry,
wherein the PLL circuit includes:
a multi-range VCO configured to generate the sampling clock in response to a fine control signal and a coarse control signal;
a frequency acquisition loop configured to generate the fine control signal in a first operating mode of the PLL circuit;
a data recovery loop configured to generate the fine control signal in a second operating mode of the PLL circuit; and
a coarse control loop configured to generate the coarse control signal, wherein the coarse control loop includes a frequency lock detector and voltage range monitoring logic, the frequency lock detector is configured to generate a lock signal in response to determining that the difference between the clock frequency and a reference frequency has decreased to within a predetermined threshold, and the coarse control loop is configured to enter a locked state in response to the lock signal.

10. The data sampling circuit of claim 9, wherein the coarse control loop is active and unlocked during the first operating mode of the PLL circuit except when said coarse control loop enters the locked state in response to the lock signal, and the coarse control loop is locked during the second operating mode of the PLL circuit.

11. The data sampling circuit of claim 9, wherein the coarse control loop continuously monitors the fine control signal during both the first operating mode and the second operating mode of the PLL circuit.

12. The data sampling circuit of claim 11, wherein the frequency lock detector continuously monitors the frequency of a frequency divided version of the sampling clock during both the first operating mode and the second operating mode of the PLL circuit, and determines when the difference between the clock frequency and the reference frequency has decreased to within the predetermined threshold as a result of such continuous monitoring.

13. The data sampling circuit of claim 9, wherein the coarse control loop is active and unlocked during both the first operating mode and the second operating mode of the PLL circuit, except when said coarse control loop enters the locked state in response to the lock signal.

14. A transceiver, including:
a PLL circuit configured to generate a clock having a clock frequency, wherein the PLL circuit includes:
a multi-range VCO configured to generate the clock in response to a fine control signal and a coarse control signal;
a frequency acquisition loop configured to generate the fine control signal in a first operating mode of the PLL circuit;
a data recovery loop configured to generate the fine control signal in a second operating mode of the PLL circuit; and
a coarse control loop configured to generate the coarse control signal, wherein the coarse control loop includes a frequency lock detector and voltage range monitoring logic, the frequency lock detector is configured to generate a lock signal in response to determining that the difference between the clock frequency and a reference frequency has decreased to within a predetermined threshold, and the coarse control loop is configured to enter a locked state in response to the lock signal.

15. The transceiver of claim 14, wherein the coarse control loop is active and unlocked during the first operating mode of the PLL circuit except when said coarse control loop enters the locked state in response to the lock signal, and the coarse control loop is locked during the second operating mode of the PLL circuit.

16. The transceiver of claim 14, wherein the coarse control loop continuously monitors the fine control signal during both the first operating mode and the second operating mode of the PLL circuit.

17. The transceiver of claim 14, wherein the transceiver is a 10 Gb Ethernet transceiver including a data sampling circuit configured to sample a received signal in response to a sampling clock, and the clock is said sampling clock.

18. The transceiver of claim 14, wherein the coarse control signal is a coarse control voltage, and the coarse control loop includes:
- circuitry configured to generate coarse control bits; and
- a DAC for generating the coarse control voltage in response to the coarse control bits.

19. A transceiver, including:
- a first receiver interface configured to receive at least one signal indicative of data having a first data rate;
- a second receiver interface configured to receive a signal indicative of data having a second data rate greater than the first data rate;
- at least one transmitter interface configured to transmit a signal indicative of data having a data rate greater than the first data rate; and additional circuitry,
- wherein the transceiver is configured to implement a clocking scheme in which no more than three phase locked loops are used for clock generation.

20. The transceiver of claim 19, including:
- first circuitry, including a first clock-generating phase locked loop, configured to generate all clocks used by the first receiver interface and at least one clock used by the additional circuitry;
- second circuitry, including a second clock-generating phase locked loop, configured to generate all clocks used by the second receiver interface and at least one clock used by the additional circuitry; and
- third circuitry, including a third clock-generating phase locked loop, configured to generate all clocks used by the transmitter interface and at least one clock used by the additional circuitry.

21. The transceiver of claim 19, wherein the first receiver interface is a multi-channel 3.125-Gb/s interface, the second receiver interface is a 10.3125-Gb/s receiver interface, the transmitter interface is a 10.3125-Gb/s transmitter interface, and the additional circuitry includes circuitry configured to perform physical coding sub-layer functions.

22. A multilayered receiver interface configured to receive and sample signals, said receiver interface including:
- sampling circuitry comprising multiple layers, wherein the sampling circuitry is configured to generate oversampled data by performing blind oversampling on the signals using a multiphase clock, and each layer of the sampling circuitry is configured to perform blind oversampling on one of the received signals using the multiphase clock;
- multilayered digital phase lock loop circuitry coupled and configured to receive the oversampled data; and
- a single clock-generating phase locked loop, wherein said clock-generating phase locked loop is an analog phase locked loop coupled and configured to generate the multiphase clock and to assert the multiphase clock to all layers of the sampling circuitry.

23. The receiver interface of claim 22, wherein said receiver interface is a four-layer 3.125-Gb/s interface.

* * * * *